United States Patent
Horibe et al.

(10) Patent No.: US 10,622,311 B2
(45) Date of Patent: Apr. 14, 2020

(54) HIGH-DENSITY INTERCONNECTING ADHESIVE TAPE

(71) Applicant: INTERNATIONAL BUSINESS MACHINES CORPORATION, Armonk, NY (US)

(72) Inventors: Akihiro Horibe, Yokohama (JP); Hiroyuki Mori, Yasu (JP); Keishi Okamoto, Kawasaki (JP)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/673,954

(22) Filed: Aug. 10, 2017

(65) Prior Publication Data

US 2019/0051603 A1   Feb. 14, 2019

(51) Int. Cl.
*H01L 21/683* (2006.01)
*H01L 23/544* (2006.01)
(Continued)

(52) U.S. Cl.
CPC ........ *H01L 23/5386* (2013.01); *H01L 21/481* (2013.01); *H01L 21/4853* (2013.01);
(Continued)

(58) Field of Classification Search
CPC ............... H01L 23/538; H01L 23/5386; H01L 21/6835; H01L 23/544; H01L 21/481;
(Continued)

(56) References Cited

U.S. PATENT DOCUMENTS 5,501,938 A   3/1996   Ellis et al.
7,151,009 B2  12/2006  Kim et al.
(Continued)

FOREIGN PATENT DOCUMENTS

CN   100576987 C   12/2009
CN   206947296 U   1/2018
(Continued)

OTHER PUBLICATIONS

Oi, "Development of New 2.5D Package with Novel Integrated Organic Interposer Substrate with Ultra-fine Wiring and High Density Bumps", 2014 Electronic & Technology Conference, May 2014, pp. 348-353.
(Continued)

*Primary Examiner* — Edward Chin
(74) *Attorney, Agent, or Firm* — Tutunjian & Bitetto, P.C.; Vazken Alexanian

(57) ABSTRACT

A technique for interconnecting chips by using an interconnection substrate is disclosed. The interconnection substrate includes a base substrate, a first group of electrodes on the base substrate for a first chip to be mounted, and a second group of electrodes on the base substrate for a second chip to be mounted. The interconnection substrate further includes an interconnection layer that includes a first set of pads for the first chip, a second set of pads for the second chip, traces and an organic insulating material. The interconnection layer is disposed on the base substrate and located within a defined area on the base substrate between the first group of electrodes and the second group of the electrodes.

16 Claims, 13 Drawing Sheets

(51) Int. Cl.
*H01L 23/538* (2006.01)
*H01L 21/48* (2006.01)
*H01L 23/00* (2006.01)
*H01L 25/065* (2006.01)
*H01L 25/00* (2006.01)

(52) U.S. Cl.
CPC ...... *H01L 21/4857* (2013.01); *H01L 21/6835* (2013.01); *H01L 23/5383* (2013.01); *H01L 23/544* (2013.01); *H01L 24/16* (2013.01); *H01L 24/50* (2013.01); *H01L 24/73* (2013.01); *H01L 25/0655* (2013.01); *H01L 25/50* (2013.01); *H01L 2221/68359* (2013.01); *H01L 2221/68381* (2013.01); *H01L 2223/54426* (2013.01); *H01L 2224/16227* (2013.01); *H01L 2224/73211* (2013.01)

(58) Field of Classification Search
CPC . H01L 24/50; H01L 21/4853; H01L 21/4857; H01L 23/5383; H01L 24/16; H01L 24/73; H01L 25/0655; H01L 25/50; H01L 2223/54426; H01L 2221/68359; H01L 2221/68381; H01L 2224/73211; H01L 2224/16227
See application file for complete search history.

(56) References Cited

U.S. PATENT DOCUMENTS

| | | | |
|---|---|---|---|
| 7,566,960 B1 * | 7/2009 | Conn | H01L 23/055 257/678 |
| 8,008,764 B2 | 8/2011 | Joseph et al. | |
| 8,866,308 B2 | 10/2014 | Roy et al. | |
| 8,872,349 B2 | 10/2014 | Chiu et al. | |
| 8,922,739 B2 * | 12/2014 | Lan | G02F 1/134309 349/141 |
| 9,136,236 B2 * | 9/2015 | Starkston | H01L 25/50 |
| 9,269,701 B2 | 2/2016 | Starkston et al. | |
| 9,349,711 B2 | 5/2016 | Lin et al. | |
| 9,601,423 B1 | 3/2017 | Arvin et al. | |
| 9,642,259 B2 | 5/2017 | Kim et al. | |
| 9,679,843 B2 | 6/2017 | Starkston et al. | |
| 9,716,067 B2 | 7/2017 | Mahajan et al. | |
| 9,754,890 B2 | 9/2017 | Deshpande et al. | |
| 9,831,169 B2 * | 11/2017 | Zhang | H01L 23/50 |
| 2002/0185744 A1 | 12/2002 | Katagiri et al. | |
| 2003/0222350 A1 | 12/2003 | Sawada | |
| 2012/0043667 A1 * | 2/2012 | Rathburn | H01L 23/49811 257/774 |
| 2013/0168854 A1 * | 7/2013 | Karikalan | H01L 24/17 257/738 |
| 2013/0181354 A1 * | 7/2013 | Khan | H01L 25/0657 257/774 |
| 2013/0292846 A1 * | 11/2013 | Lee | H01L 23/538 257/774 |
| 2014/0070380 A1 | 3/2014 | Chiu et al. | |
| 2014/0170814 A1 | 6/2014 | Okuda et al. | |
| 2015/0075849 A1 * | 3/2015 | Yap | H01L 24/43 174/257 |
| 2016/0135292 A1 | 5/2016 | Lee | |
| 2017/0025341 A1 | 1/2017 | Chaparala et al. | |
| 2017/0287831 A1 | 10/2017 | Starkston et al. | |

FOREIGN PATENT DOCUMENTS

| | | |
|---|---|---|
| CN | 107710336 A | 2/2018 |
| DE | 102016124862 A1 | 7/2017 |
| JP | 2013098403 A | 5/2013 |
| JP | 2015214028 A | 12/2015 |

OTHER PUBLICATIONS

U.S. Office Action issued in U.S. Appl. No. 15/804,364 dated Jun. 15, 2018, 12 pages.
List of IBM Patents or Patent Applications Treated as Related dated Oct. 16, 2018, 2 pages.
International Search Report issued in PCTIB2018055761 dated Dec. 12, 2018, 9 pages.
Notice of Allowance for U.S. Appl. No. 15/804,364 dated Aug. 27, 2019 (10 pages).

* cited by examiner

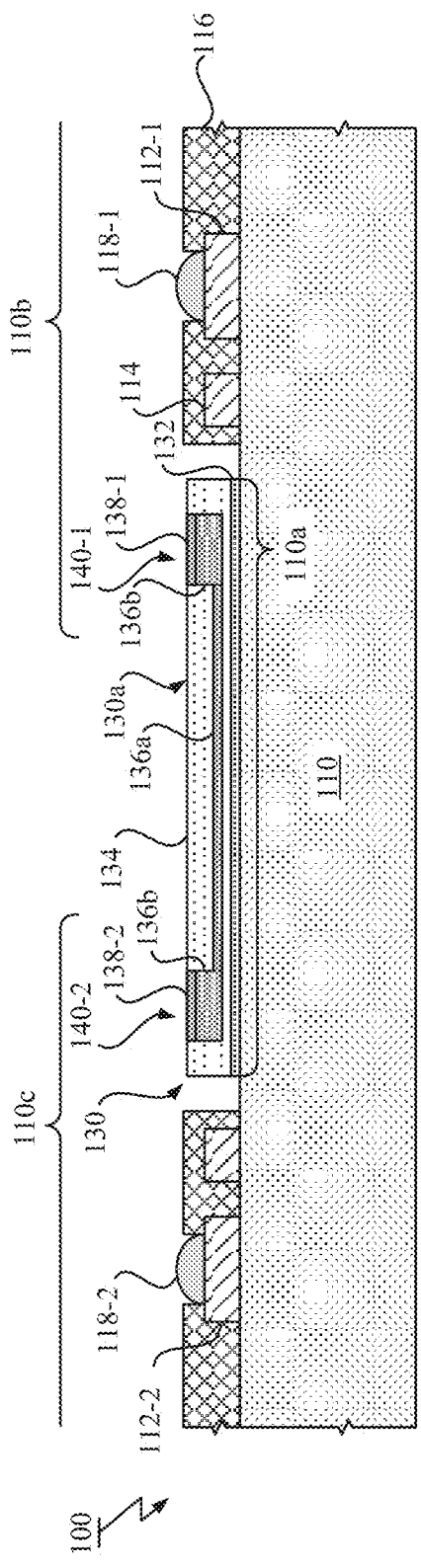
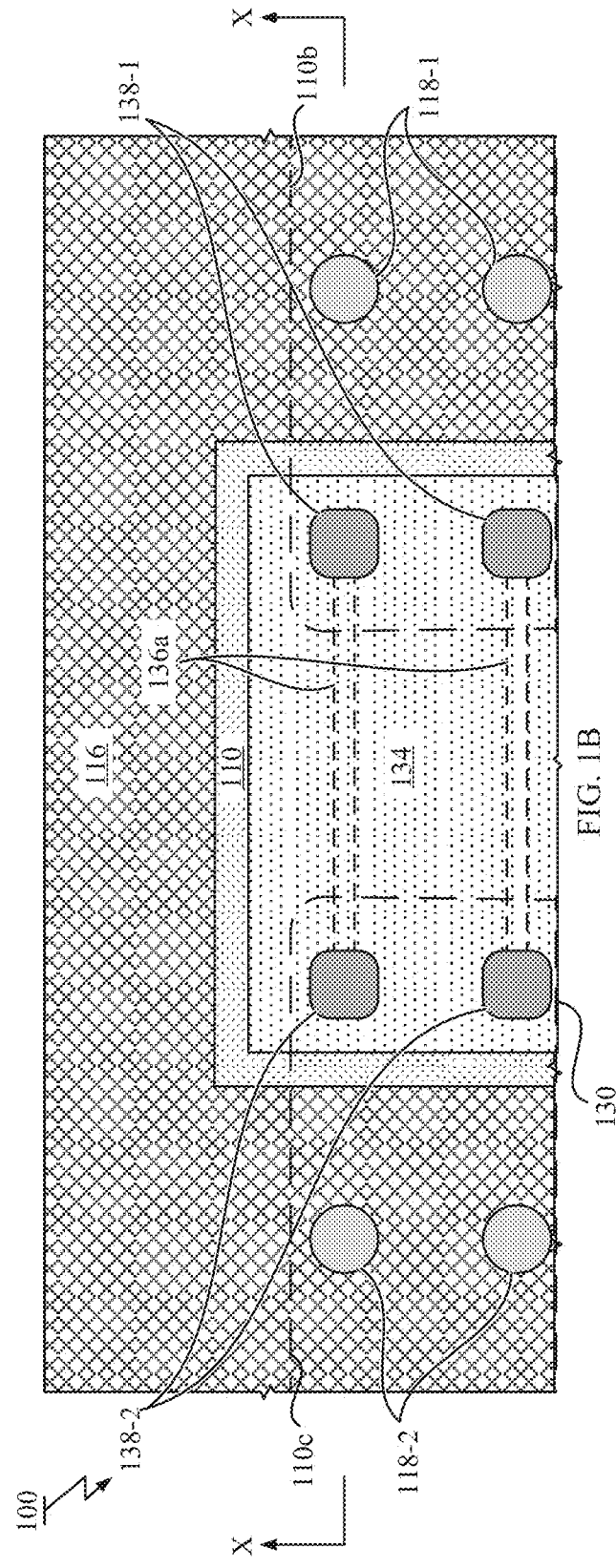
FIG. 1A
FIG. 1B

PRIOR ART

HIGH-DENSITY INTERCONNECTING ADHESIVE TAPE

BACKGROUND

Technical Field

The present invention, generally, relates to interconnection technology, more particularly, to an interconnection substrate used for interconnecting chips mounted thereon, an electronic device including the interconnection substrate, an interconnection layer carrying structure and methods of fabricating thereof.

Description of Related Art

In response to growing demand for wide band signal transmission between chips (or dice), several technologies targeting high density interconnections between chips have been proposed, including silicon interposer, EMIB (Embedded Multi-Die Interconnect Bridge) and iTHOP (integrated Thin film High density Organic Package).

The silicon interposer technology requires an expensive BEOL (Back End Of Line) process to form high density circuitries on the silicon interposer and a TSV (Through Silicon Via) fabrication process to connect metallization layers on its front and back surfaces. Also large insertion loss is caused by the TSV since the silicon into which the TSVs are fabricated is a semiconductor, not an insulator.

The EMIB (Embedded Multi-Die Interconnect Bridge) suffers from a problem of mechanical stress due to CTE (Coefficient for Thermal Expansion) mismatch between an organic substrate and a silicon bridge interconnect assembly embedded in the organic substrate, resulting in negative impacts on interconnection reliability and production yield.

The iTHOP requires an expensive chemical mechanical polishing (CMP) process as well as delicate fabrication processes to form high density interconnection layer over an organic build-up substrate. The organic substrate on which the interconnection layer is fabricated is generally an unstable and warped substrate. Thus, production yield would be lowered.

Therefore, there is a need for a novel structure capable of achieving inexpensive, high density interconnections between chips mounted thereon while keeping reliability of the interconnections.

SUMMARY

According to an embodiment of the present invention, an interconnection substrate for interconnecting chips is provided. The interconnection substrate includes a base substrate, a first group of electrodes on the base substrate for a first chip to be mounted, and a second group of electrodes on the base substrate for a second chip to be mounted. The interconnection substrate further includes an interconnection layer including a first set of pads for the first chip, a second set of pads for the second chip, a plurality of traces and an organic insulating material. In the interconnection substrate, the interconnection layer is disposed on the base substrate and located within a defined area on the base substrate between the first group and the second group of the electrodes.

In the interconnection substrate according to the embodiment of the present invention, signal transmission between the chips can be achieved through the interconnection layer that is disposed on the base substrate and located within the defined area on the base substrate. Furthermore, the interconnection layer includes an organic insulating material. Therefore, density of the interconnections can be increased while keeping reliability of the interconnections. The insertion loss can be reduced and its production yield can also be improved.

In a preferable embodiment, the interconnection layer further includes a bottom adhesive layer bonded to the base substrate. By employing the structure that enables bonding of the interconnection layer with the base substrate, the base substrate and the interconnection layer, having interconnections precisely formed separately from the base substrate, can be assembled.

In other preferable embodiment, the base substrate is an organic substrate and the interconnection layer is provided by fabricating a structure of the interconnection layer on a support substrate and transferring the structure without the support substrate onto the base substrate. Since both of the interconnection layer and the base substrate are made of organic material and the support substrate on which the structure of the interconnection layer has been fabricated no longer exists in the interconnection substrate, thermal expansion coefficient (CTE) mismatch between the base substrate and a member for providing interconnections can be preferably alleviated.

According to other embodiment of the present invention, an interconnection layer carrying structure for transferring an interconnection layer onto a substrate is provided. The interconnection layer carrying structure includes a support substrate, a release layer on the support substrate and an interconnection layer structure on the release layer. The interconnection layer structure includes an organic insulating material, a first set of pads configured to face towards the support substrate, a second set of pads configured to face towards the support substrate, and a plurality of traces embedded in the organic insulating material. The interconnection layer structure includes further an adhesive layer formed on a top of the organic insulating material.

The interconnection layer carrying structure according to other embodiment of the present invention can be used to transfer a precisely formed interconnection layer onto a substrate in order to fabricate the aforementioned interconnection substrate. The density of the interconnections can be increased while keeping reliability of the interconnections. Provision of the interconnection layer carrying structure can reduce production cost and improve production yield of the interconnection substrate.

According to another embodiment of the present invention, a method for fabricating an interconnection substrate used for interconnecting chips mounted thereon is provided. The method includes preparing a base substrate provided with a first group of electrodes for a first chip and a second group of electrodes for a second chip thereon. The method also includes attaching an interconnection layer to the base substrate such that the interconnection layer is positioned at a defined area on the base substrate between the first group and the second group of the electrodes. In the method, the interconnection layer includes a first set of pads for the first chip, a second set of pads for the second chip, a plurality of traces and an organic insulating material.

According to another embodiment of the present invention, the interconnection layer enabling signal transmission between the chips is attached to the base substrate. Thus, the interconnection layer can be fabricated on another substrate different from the base substrate, thereby enabling interconnections in the interconnection layer to be precisely formed. Therefore, density of the interconnections can be increased while keeping reliability of the interconnections. Furthermore, the production yield of the interconnection substrate can be improved since the interconnection layer can be inspected before attaching to the base substrate.

In an embodiment, attaching the interconnection layer includes placing an interconnection layer carrying structure on the base substrate, in which the interconnection layer carrying structure includes an interconnection layer, a release layer on the interconnection layer and a support substrate on the release layer. In the method, attaching the interconnection layer includes further releasing the interconnection layer from the support substrate by removing the release layer. Thereby, the interconnection layer can be efficiently fabricated on the base substrate.

In a further embodiment, the support substrate has transparency. In the method, removing the release layer includes ablating the release layer by illumination through the support substrate. Thereby, the support substrate can be removed efficiently from the interconnection layer attached to the base substrate.

According to another embodiment of the present invention, a method for fabricating an interconnection layer carrying structure used for transferring an interconnection layer onto a substrate is provided. The method includes preparing a support substrate. The method also includes applying a release layer on the support substrate. The method further includes forming a first organic insulating material layer having a plurality of openings. The method includes further building a plurality of pads in the openings and a plurality of traces on the first organic insulating material layer. The method also includes further forming a second organic insulating material layer over the plurality of the traces and the first organic insulating material layer.

The interconnection layer carrying structure fabricated by the method according to another embodiment of the present invention can be used to transfer a precisely formed interconnection layer onto a substrate to fabricate the aforementioned interconnection substrate. The density of the interconnections can be increased while keeping reliability of the interconnections. Provision of the interconnection layer carrying structure can reduce production cost and improve production yield of the interconnection substrate.

According to another embodiment of the present invention, an electronic device including the aforementioned interconnection substrate is provided. The electronic device also includes the first chip mounted on the interconnection substrate, in which the first chip is located at a position corresponding to the first group of the electrodes and the first set of the pads of the interconnection layer. The electronic device further includes a second chip mounted on the interconnection substrate, in which the second chip is located at a position corresponding to the second group of the electrodes and the second set of the pads of the interconnection substrate.

The electronic device according to another embodiment of the present invention can have a reliable interconnection with higher density.

According to another embodiment of the present invention, a method for fabricating an electronic device is provided. The method includes preparing the aforementioned interconnection substrate. The method also includes placing the first chip on the interconnection substrate. The method further includes placing the second chip on the interconnection substrate. The method includes further fixing the first chip and the second chip on the interconnection substrate.

The electronic device fabricated by the method according to further another embodiment of the present invention can have a reliable interconnection with higher density.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter, which is regarded as the invention, is particularly pointed out and distinctly claimed in the claims at the conclusion of the specification. The foregoing and other features and advantages of the invention are apparent from the following detailed description taken in conjunction with the accompanying drawings. Note that the sizes and relative positions of elements and layers in the drawings are not necessarily drawn to scale. Some of these elements or layers are arbitrarily enlarged and positioned for improving legibility of drawing.

FIG. 1A illustrates a cross section view schematic of an interconnection substrate along line X-X as shown in FIG. 1B according to an embodiment of the present invention.

FIG. 1B illustrates a top view schematic of an interconnection substrate according to an embodiment of the present invention.

DETAILED DESCRIPTION

Figure 2:
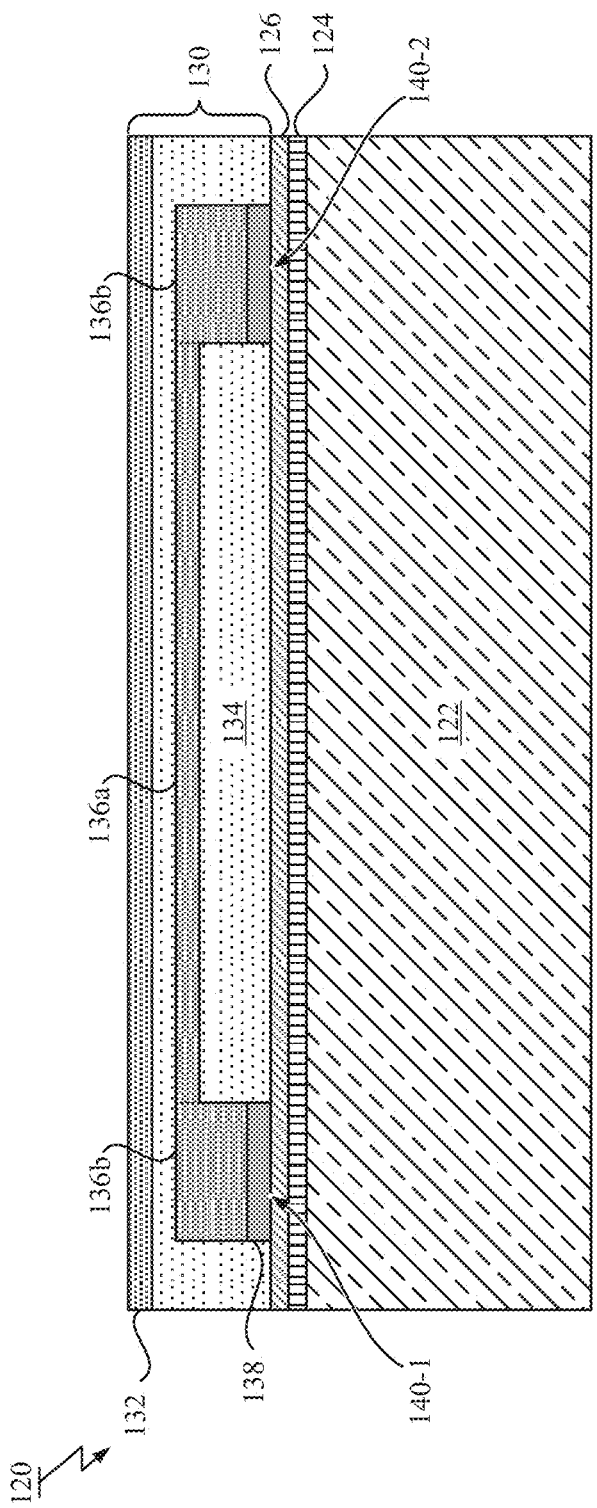
FIG. 2 illustrates a schematic of an interconnection layer carrying structure that can be used for transferring an interconnection layer onto a target substrate according to an embodiment of the present invention.

Now, the present invention will be described using particular embodiments, and the embodiments described hereafter are understood to be only referred to as examples and are not intended to limit the scope of the present invention.

One or more embodiments according to the present invention are directed to an interconnection substrate, an electronic device including the interconnection substrate, an interconnection layer carrying structure used for fabrication of the interconnection substrate, a method for fabricating the interconnection substrate, a method for fabricating the electronic device and a method for fabricating the interconnection layer carrying structure, in which high density interconnections between chips mounted on the interconnection substrate are achieved in a novel manner.

Hereinafter, referring to FIGS. 1A, 1B, a schematic of an interconnection substrate according to an exemplary embodiment of the present invention is described.

FIGS. 1A, 1B illustrate a schematic of an interconnection substrate 100 for interconnecting chips to be mounted thereon. FIG. 1A shows a cross-sectional view of the interconnection substrate 100 and FIG. 1B shows a top view of the interconnection substrate 100. Note that the cross-sectional view shown in FIG. 1A corresponds to a cross-section indicated by "X" in the top view of FIG. 1B.

As shown in FIG. 1A, the interconnection substrate 100 includes an organic base substrate 110; a plurality of electrodes 112 formed on the top surface of the organic base substrate 110; and an interconnection layer 130 disposed on the organic base substrate 110.

The organic base substrate 110 may be a build-up substrate having an appropriate number of wiring layers and interlayer dielectrics, which may be fabricated by any suitable build-up process. The plurality of electrodes 112 on the organic base substrate 110 may be an outermost layer of the build-up substrate. The organic base substrate 110 may also have an alignment mark 114 on the top surface thereof. Note that the internal layer structure in the organic base substrate 110 is omitted from the drawings for the purpose of illustration.

In a particular embodiment, the interconnection substrate 100 also includes a solder resist layer 116 formed on the organic base substrate 110. Each electrode 112 may be covered by the solder resist layer 116 and exposed from the solder resist layer 116 through an opening that is formed in the solder resist layer 116. Each electrode 112 may have a pre-solder 118 formed in the opening of the solder resist 116. The thickness of the electrode 112 may typically range from several micrometers to ten and several micrometers. The thickness of the solder resist layer 116 may be in the range of its adequate film thickness and may typically range from 10 micrometers to 40 micrometers.

The plurality of the electrodes 112 may include one group of electrodes (hereinafter, referred to as a first group) 112-1 that are positioned at a flip-chip area 110*b* on the interconnection substrate 100. The plurality of the electrodes 112 may also include other group of electrodes (hereinafter, referred to as a second group) 112-2 that are positioned at a different flip-chip area 110c on the interconnection substrate 100. The second group of the electrodes 112-2 may be located at a distance from the first group of the electrodes 112-1. Note that the pre-solders 118-1, 118-2 formed on the electrodes 112-1, 112-2 are depicted in the top view of FIG. 1B. The flip-chip area 110b is an area where one chip (hereinafter, referred to as a first chip) would be mounted in a subsequent chip mounting process. The flip-chip area 110c is an area where another chip (hereinafter, referred to as the second chip) would be mounted in the subsequent chip mounting process.

The interconnection layer 130 is disposed on the top surface of the organic base substrate 110 and located within a defined area 110a between the first group of the electrodes 112-1 and the second group of the electrodes 112-2. The defined area 110a where the interconnection layer 130 is disposed has no solder resist. The interconnection layer 130 may be precisely positioned at the defined area 110a by using the alignment mark 114 and attached to the organic base substrate 110. Note that the defined area 110a for the interconnection layer 130 overlaps with both of the flip-chip areas 110b, 110c, partially.

Further referring to FIG. 1A, a more detailed structure of the interconnection layer 130 is also depicted. The interconnection layer 130 includes a bottom adhesive layer 132 by which the interconnection layer 130 is fixed to the top surface of the organic base substrate 110; an organic insulating material 134 that may be formed on the bottom adhesive layer 132; a conductive pattern 136 embedded in the organic insulating material 134; and a plurality of pads 140 exposed at the top surface 130a of the interconnection layer 130. In a particular embodiment, the organic insulating material 134 may form the top surface 130a of the interconnection layer 130.

The conductive pattern 136 may include a plurality of trace 136a and a plurality of pad parts 136b, each of which constitutes a pad 140. Each pad 140 may be made up of the pad part 136b of the conductive pattern 136 and a metal stack 138 formed on the pad part 136b.

The plurality of the pads 140 includes one set of pads (hereinafter, referred to as a first set) 140-1 that are positioned at the flip-chip area 110b and other set of pads (hereinafter, referred to as a second set) 140-2 that are positioned at the different flip-chip area 110c. Note that the metal stacks 138-1, 138-2 of the pads 140-1, 140-2 are depicted in the top view of FIG. 1B. Also note that edges of the trace 136a formed in the organic insulating material 134 are indicated by dashed lines in the top view of FIG. 1B. As shown in FIG. 1A, a corresponding pad 140-1 in the first set and a corresponding pad 140-2 in the second set are electrically coupled by a corresponding trace 136a.

Since the top view of FIG. 1B shows a part of the interconnection substrate 100, there are merely two pads 140 and two electrodes 112 for each chip in FIG. 1B. However, the number of the pads 140 and the number of the electrodes 114 for each chip depends on the specification of the chip. Generally, one or more electrodes for each chip may be placed on the organic base substrate 110 and one or more pads for each chip may be formed in the interconnection layer 130.

As described later, the first set of the pads 140-1 and the first group of the electrodes 112-1 together are configured to receive bumps of the first chip. The second set of the pads 140-2 and the second group of the electrodes 112-2 together are configured to receive bumps of the second chip.

Hereinafter, referring to FIG. 2, an interconnection layer carrying structure 120 used for transferring an interconnection layer onto a target substrate is described.

FIG. 2 illustrates a schematic of an interconnection layer carrying structure that can be used for transferring the interconnection layer 130 onto the organic base substrate 110 in order to fabricate the interconnection substrate 100 shown in FIGS. 1A and 1B. The view shown in FIG. 2 is a cross-sectional view of the interconnection layer carrying structure 120.

As shown in FIG. 2, the interconnection layer carrying structure 120 includes a support substrate 122; a release layer 124 on the support substrate 122; and an interconnection layer 130 on the release layer 124. Note that the interconnection layer 130 shown in FIG. 2 is illustrated with facing upside down with respect to the view shown in FIG. 1A.

The support substrate 122 is a rigid and stable substrate used to fabricate the interconnection layer 130 thereon. The support substrate 122 is suitably any substrate as long as it provides adequate rigidity and stability. In one or more embodiments, the support substrate 122 may be an inorganic substrate including glass, semiconductor, ceramic, etc. In an embodiment, the support substrate 122 is a glass substrate since the glass substrate has transparency and thermal expansion coefficient (CTE) (3~12 ppm/degrees Celsius) closer to that of organic material used to build the interconnection layer 130 in comparison with silicon substrate, for example. Such glass substrate may include soda lime glass, borosilicate glass, fused silica, synthetic quartz glass, to name but a few.

The release layer 124 is a release coating configured to release the interconnection layer 130 from the support substrate 122 by appropriate treatment. When the support substrate 122 has transparency, UV (ultraviolet)/IR (infrared)/visible light can be irradiated to the release layer 124 from the back side of the support substrate 122 to release the interconnection layer 130 from the support substrate 122.

In one or more embodiments, the release layer 124 may be any known light sensitive release layer that allows de-bonding from the support substrate interface with laser illumination in the field of wafer bonding/de-bonding technology. In a particular embodiment, a light-to-heat conversion release coating, which converts absorbed light energy to heat, may be used as the release layer 124. In other particular embodiment, a UV ablation layer that is highly absorptive in the ultraviolet spectrum may be used as the release layer 124. In these particular embodiments, the release layer 124 may be burned, broken down or decomposed by ablating the release layer 124 using laser illumination so as to release the interconnection layer 130 from the support substrate 122 after the interconnection layer 130 is fixed to the organic base substrate 110.

In other embodiments, the release layer 124 may be a thermal or UV-releasable adhesive layer whose adhesive property disappears or degrades by heat or UV irradiation. Residual of the release layer 124 can be cleaned after releasing if necessary. In further other embodiments, any of the known de-bonding methods including mechanical peel-off method, thermal slide-off method and solvent release method can be adopted.

As shown in FIG. 2, the interconnection layer carrying structure 120 may further include a seed metal layer 126 between the release layer 124 and the interconnection layer 130. The seed metal layer 126 may be used to deposit conductive material (e.g., the metal stack 138) on the support substrate 122 by electrolytic plating. In a particular embodiment, the seed metal layer 126 may be made of Ti/Cu stacks.

As described with referring to FIG. 1A, the interconnection layer 130 includes the organic insulating material 134; the plurality of the pads 140 configured to face towards the support substrate 122; the plurality of the traces 136a embedded in the organic insulating material 134. The interconnection layer 130 further includes the (top) adhesive layer 132 formed on the top of the organic insulating material 134. In a particular embodiment, the adhesive layer 132 may fully cover the top surface of the organic insulating material 134.

The plurality of the pads 140 includes the first set of the pads 140-1 and the second set of the pads 140-2, in which each corresponding pair of the pad 140-1 and the pad 140-2 is coupled by corresponding one of the traces 136a. The organic insulating material 134 may be disposed on the seed metal layer 126. The pads 140 may be in contact with the seed metal layer 126 at the bottom surface of the organic insulating material 134. In the described embodiment, each pad 140 includes the metal stack 138 formed on the seed metal layer 126.

Materials used for the adhesive layer 132 may be made of any one of adhesive material, which may be thermosetting or thermoplastic polymer material, including epoxy resin, acrylic resin, to name but a few. The organic insulating material 134 may be any one of photosensitive insulating resins such as PI (polyimide), BCB (benzocyclobutene), polybenzoxazole (PBO), or other photosensitive polymers. The conductive pattern 136, including the trace 136a and the pad parts 136b, may be made of any one of metal materials (e.g., Cu, Al, etc.) and other conductive materials. In a particular embodiment, metal copper may be used for the conductive pattern 136. The metal stack 138 may be, but not limited to, an Au/Pd/Ni stack, that is worked as a metallurgy on the side of the organic base substrate 110 to which the chip and its bump are joined.

As shown in FIG. 2, the interconnection layer 130 is provided as being fabricated on the support substrate 122 in a form of an adhesive tape formed by organic material. A process to fabricate the interconnection layer carrying structure 120 will be described later.

Hereinafter, referring to FIGS. 3A-3B and FIGS. 4A-4C, a process for fabricating an interconnection substrate by using an interconnection layer carrying structure according to an exemplary embodiment of the present invention is described. FIGS. 3A-3B and FIGS. 4A-4C illustrate cross-sectional views of structure being obtained at each step of the fabrication process of the interconnection substrate 100.

Figure 3A:
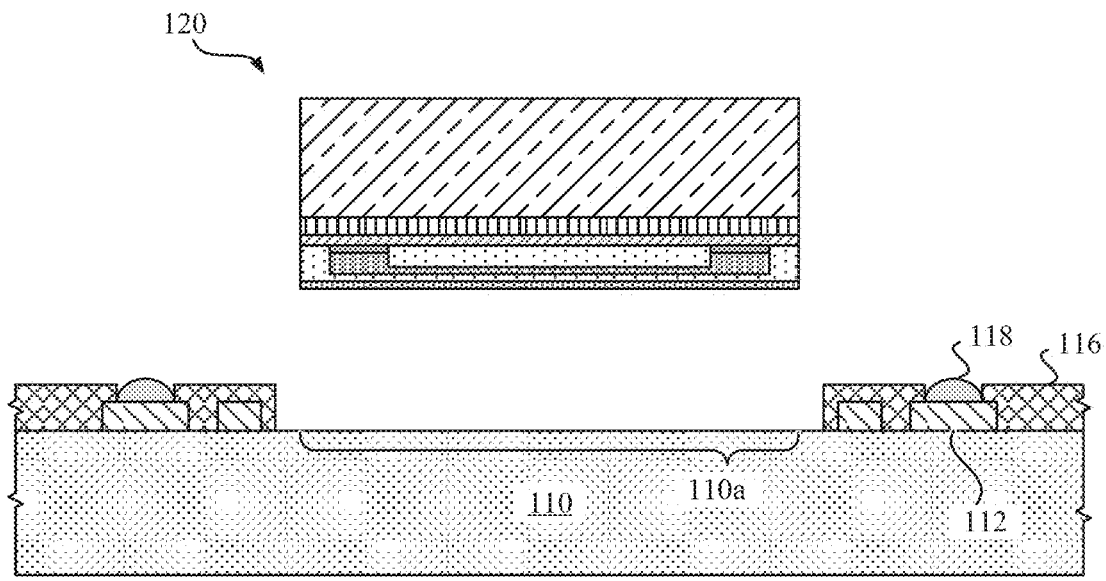
FIG. 3A illustrates a cross-sectional view of the structure before the interconnection layer is attached to the interconnection substrate according to an embodiment of the present invention.

As shown in FIG. 3A, the fabrication process may include a step of preparing the organic base substrate 110 and the interconnection layer carrying structure 120. The organic base substrate 110 prepared by this step may be provided with the plurality of the electrodes 112 having the pre-solder 118 and the solder resist layer 116 formed thereon. Note that there is a defined area 110a on the organic base substrate 110 where no solder resist is present.

Figure 3B:
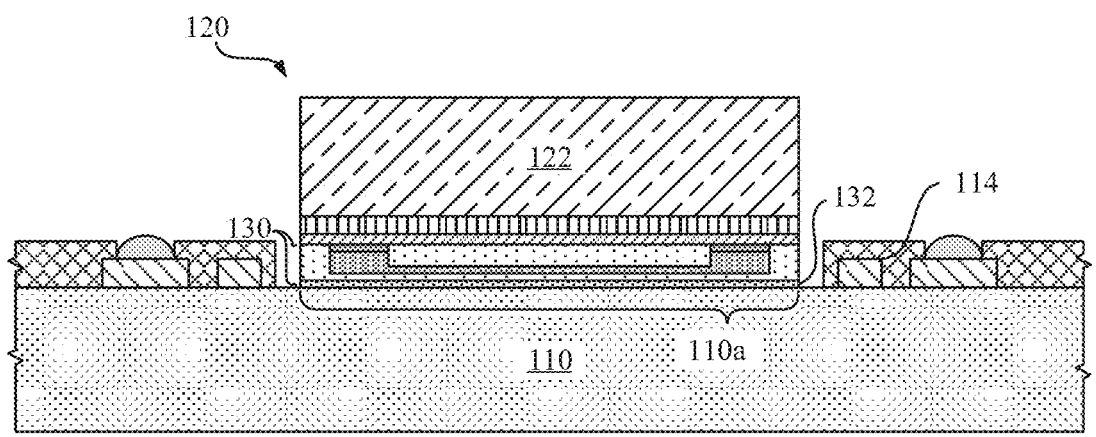
FIG. 3B illustrates a cross-sectional view of the structure after the interconnection layer is attached to the interconnection substrate according to an embodiment of the present invention.

As shown in FIG. 3B, the fabrication process may include a step of placing the interconnection layer carrying structure 120 on the organic base substrate 110 by a bonder in a upside down manner such that the pads 140 faces up and the adhesive layer 132 face down. The bottom of the adhesive 132 is attached to the top surface of the organic base substrate 110 within the defined area 110a. Since the pads 140 of the interconnection layer 130 and the electrodes 112 on the organic base substrate 110 are configured to receive bumps of chips to be mounted, the interconnection layer carrying structure 120 is positioned precisely at the defined area 110a by using the alignment mark 114 that may be formed on the organic base substrate 110 in advance. The fabrication process may further include a step of curing the adhesive layer 132 so as to firmly bond the interconnection layer 130 to the organic base substrate 110 after the step of placing the interconnection layer carrying structure 120 on the organic base substrate 110.

Figure 4A:
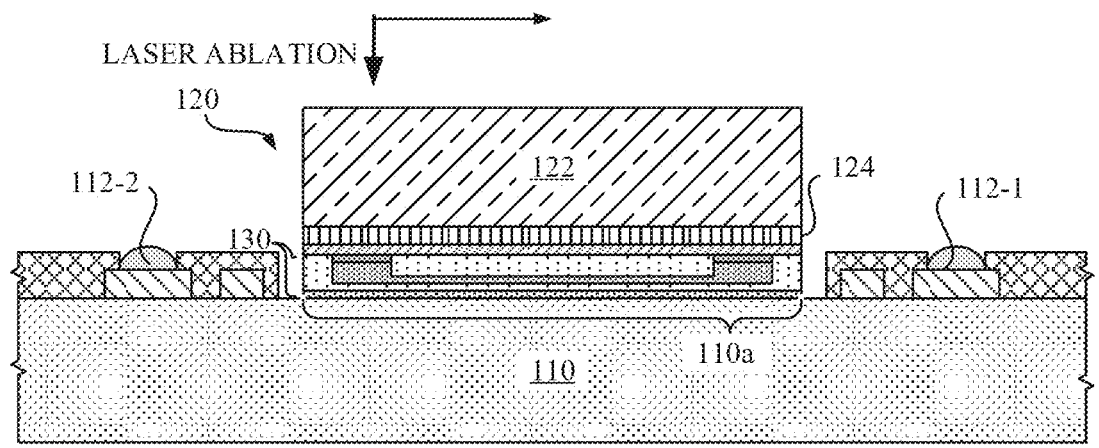
FIG. 4A illustrates a cross-sectional view of the interconnection layer being transferred to the interconnection substrate according to an embodiment of the present invention.

As shown in FIG. 4A, the fabrication process may include a step of releasing a lower structure (including the interconnection layer 130) from the support substrate 122 by removing the release layer 124. In a particular embodiment, the support substrate 122 has transparency and the step of releasing from the support substrate 122 may be done by ablating the release layer 124 with laser illumination through the support substrate 122 while scanning the laser beam.

By performing aforementioned steps, the lower structure including the interconnection layer 130 with the seed metal layer 126 is attached to the organic base substrate 110 and precisely positioned at the defined area 110a between the first group of the electrodes 112-1 and the second group of the electrodes 112-2.

Figure 4B:
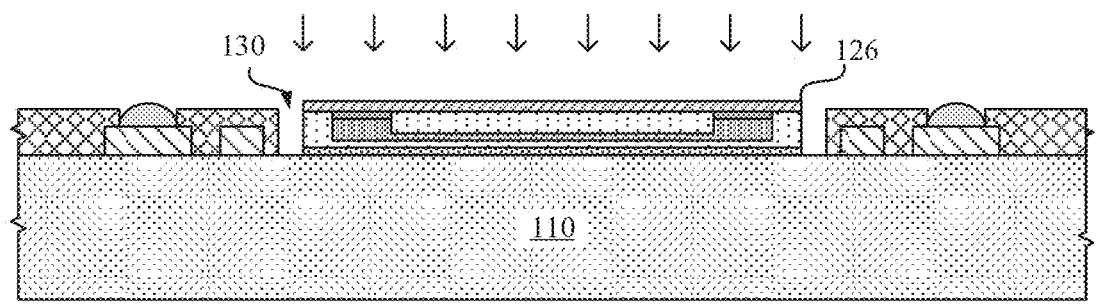
FIG. 4B illustrates a cross-sectional view of the interconnection layer having been applied to the interconnection substrate with a release layer removed according to an embodiment of the present invention

As shown in FIG. 4B, the fabrication process may include a step of etching the seed metal layer 126 formed on the interconnection layer 130 to reveal the top surface 130a of the interconnection layer 130 after the step of removing the release layer 124.

Figure 4C:
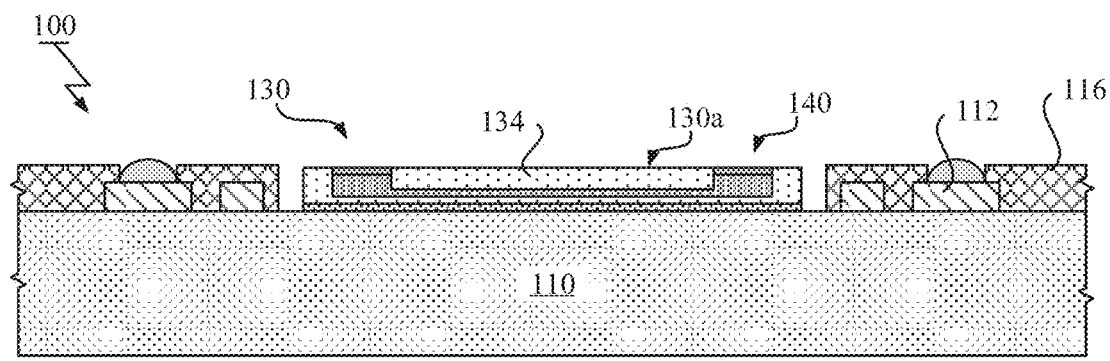
FIG. 4C illustrates a cross-sectional view of the interconnection layer applied to the interconnection substrate according to an embodiment of the present invention.

After the etching step, each pad 140 may be exposed at the top surface 130a of the interconnection layer 130, as depicted in FIG. 4C. The interconnection substrate 100 obtained by the fabrication process shown in FIGS. 3A-3B and FIGS. 4A-4C, which includes the organic base substrate 110, the plurality of the electrodes 112, the solder resist layer 116 and the interconnection layer 130, can be passed to a subsequent process such as chip mounting process.

Hereinafter, referring to FIGS. 5A-5C, FIG. 6, FIGS. 7A-7C, an electronic device including the interconnection substrate and chips mounted thereon and a method for fabricating the electronic device according to an exemplary embodiment of the present invention is described.

Figure 5A:
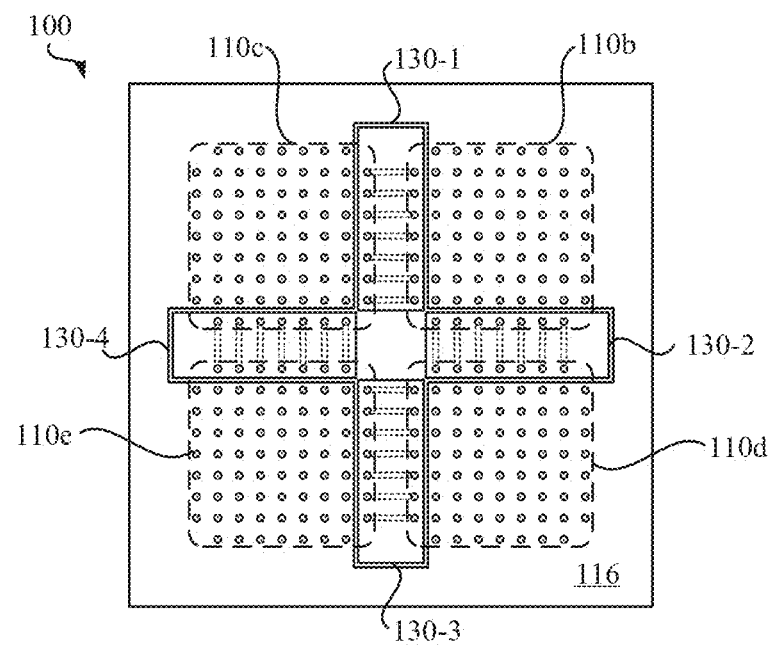
FIG. 5A illustrates a top view schematic of an electronic device including an interconnection substrate as an interposer before chip mounting according to an embodiment of the present invention.
Figure 5B:
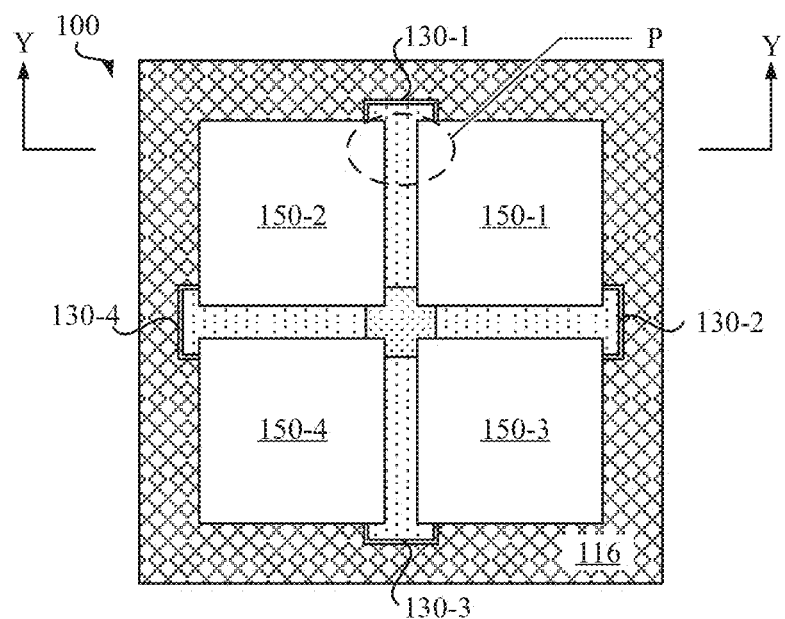
FIG. 5B illustrates a top view schematic of an electronic device including an interconnection substrate as an interposer after chip mounting according to an embodiment of the present invention.
Figure 5C:
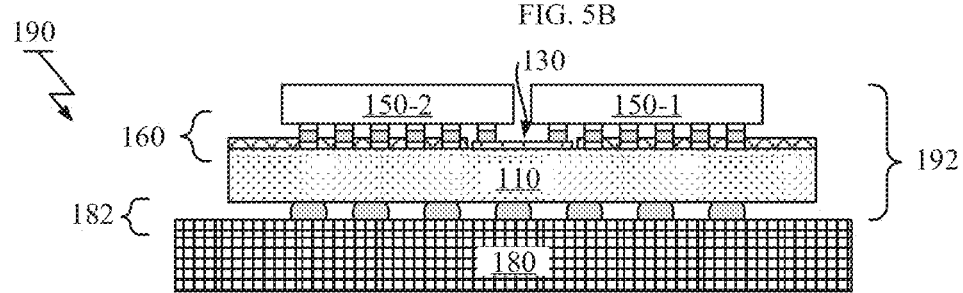
FIG. 5C illustrates a side view schematic of an electronic device along line Y-Y of FIG. 5B including an interconnection substrate as an interposer according to an embodiment of the present invention.

FIGS. 5A-5C illustrate a schematic of an electronic device 190 including an interconnection substrate 100 as an interposer. FIG. 5A shows a top view of an interconnection substrate 100 before chip mounting. FIG. 5B shows a top view of the interconnection substrate 100 after chip mounting. FIG. 5C shows a schematic of a novel package structure for the electronic device 190 with the interconnection substrate 100.

In the interconnection substrate 100 shown in FIG. 5A, there are four flip-chip areas 110b-110e for four chips 150-1-150-4, respectively. Also there are four interconnection layers 130-1-130-4, each of which is located at a corresponding defined area between any two adjacent flip-chip areas.

For example, the first interconnection layer 130-1 is located at a defined area between two flip-chip areas 110b, 110c for the chips 150-1, 150-2. For example, the second interconnection layer 130-2 is located at a defined area between two flip-chip areas 110b, 110d for the chips 150-1, 150-3. Note that the second interconnection layer 130-2 is depicted as being separated from the first interconnection layer 130-1 in FIG. 5A. However, in another embodiment, the second interconnection layer 130-2 may be formed as a part of the first interconnection layer 130-1. The same may hold for other interconnection layers 130-3, 130-4.

In FIG. 5A, positions of the pads 140 of the interconnection layers 130-1-130-4 and positions of the electrodes 112 on the organic base substrate 110 are indicated by gray circles. Also, edges of the traces formed in the interconnection layers 130-1-130-4 are indicated by dashed lines.

As shown in FIG. 5A, the first set of the pads of the first interconnection layers 130-1 and the first group of the electrodes in the first flip-chip area 110b forms a two-dimensional (2D) array on which an array of bumps of the first chip 150-1 is mounted. The second set of the pads of the first interconnection layers 130-1 and the second group of the electrodes in the second flip-chip area 110c forms a 2D array on which an array of bumps of the second chip 150-2 is mounted. The same may hold for other combinations of adjacent chips (150-1&150-3, 150-2&150-4, 150-3&150-4).

Note that the pitch between pads and/or electrodes and the sizes of the pads and the electrodes are depicted as being identical over the entire flip-chip area 110b. However, the pitch and the sizes may be designed depending on the pitch between bumps and the size of the bumps of the chip 150 according to its specification. The chip may have a single pitch and single size bumps or may have mixed pitch and/or mixed size bumps depending on their specification. For example, fine pitch Cu pillar bumps can be used for ultra-high density signal connections between chips while coarse pitch micro-bumps are used for power and ground connections.

As shown in FIG. 5B, there are four chips 150-1-150-4 mounted on the interconnection substrate 100. The first chip 150-1 and the adjacent second chip 150-2 can perform signal transmission each other through the first interconnection layer 130 that is located between the first and second chips 150-1, 150-2. The same may hold for other combinations of adjacent chips (150-1&150-3, 150-2&150-4, 150-3&150-4).

Figure 6:
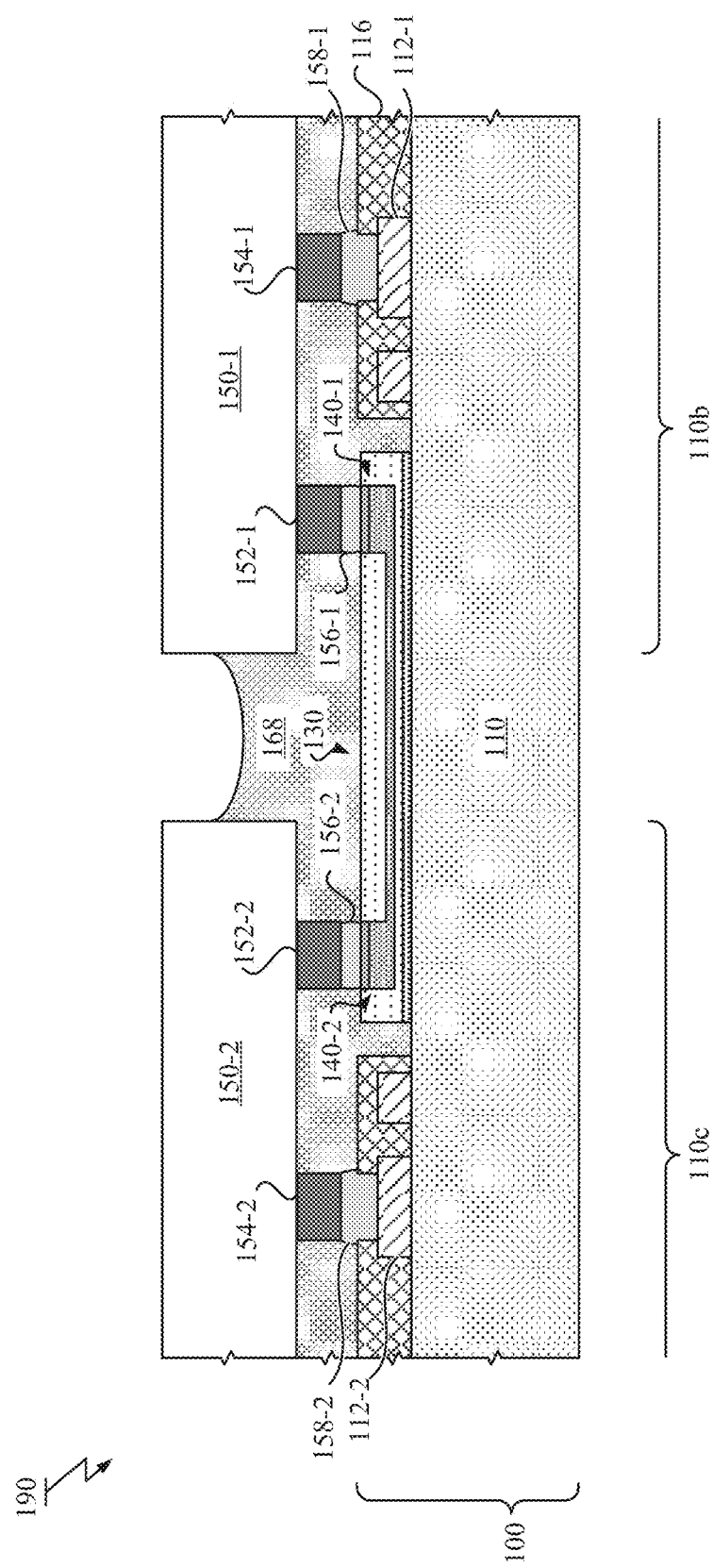
FIG. 6 illustrates a cross-sectional view of the electronic device around an interconnection layer according to an embodiment of the present invention.

FIG. 6 shows a cross-sectional view of the electronic device 190. Note that the cross-sectional view shown in FIG. 6 corresponds to an enlarged view of a portion indicated by a dashed circle P along with a cross-section indicated by "Y" in the top view of FIG. 5B.

As shown in FIG. 6, the electronic device 190 includes the aforementioned interconnection substrate 100; and the first and second chips 150-1, 150-2 mounted on the interconnection substrate 100 with facing down. Each chip 150 may be located at a position corresponding to the flip-chip area 110b/110c on the interconnection substrate 100. The gap between the interconnection substrate 100 and the chips 150-1, 150-2 may be filled by an underfill 168, which may be made of epoxies or urethanes. The gap height between the interconnection substrate 100 and the chips 150-1, 150-2 may depend on the bump height. In one embodiment, the gap height may be, but not limited to, several tens of micrometers.

The first group of the electrodes 112-1 and the first set of the pads 140-1 are positioned within the first flip-chip area 110b where the first chip 150-1 is mounted. The second group of the electrodes 112-2 and the second set of the pads 140-2 are positioned within the second flip-chip area 110c where the second chip 150-2 is mounted The first chip 150-1 has a set of peripheral bump's pillars 152-1 electrically connected to the first set of the pads 140-1 of the interconnection layer 130 through a solder 156-1. The first chip 150-1 has also a set of other bump's pillars 154-1 electrically connected to the first group of the electrodes 112-1 on the organic base substrate 110 through a solder 158-1. Although not shown in FIG. 6, the first chip 150-1 may have one or more sets of other peripheral bump's pillars for electrically interconnecting with one or more other chips, respectively. The second chip 150-2 has a set of peripheral bump's pillars 152-2 electrically connected to the second set of the pads 140-2 through a solder 156-2 and a set of other bump's pillars 154-2 electrically connected to the second group of the electrodes 112-2 through a solder 158-2.

With reference to FIG. 5C, a schematic of a novel package structure for the electronic device 190 with the interconnection substrate 100 is depicted. Even though the package structure shown in FIG. 5C may be referred to as a multi-chip package; however, the novel package structure provides functionality equal to or better than 2.5 D integration, which generally requires an expensive member such as a silicon interposer with BEOL and TSV.

As shown in FIG. 5C, a plurality of chips (150-1, 150-2 in FIG. 5C) are mounted on the interconnection substrate 100 through flip-chip interconnections 160 between bumps of the chips 150 and electrodes and pads formed on the interconnection substrate 100. The interconnection substrate 100 on which the chips 150-1~150-4 are mounted constitutes an electronic package 192, which may be one of the electronic devices according to one or more embodiments of the present invention. The electronic package 192 may have bumps formed at the bottom of the interconnection substrate 100 and is further mounted on a motherboard 180 through package interconnections 182 between the bumps of the interconnection substrate 100 and electrodes formed on the mother board 180. The final assembly product 190 including the interconnection substrate 100, the chips 150 and the mother board 180 may also be one of the electronic devices according to one or more embodiments of the present invention.

The plurality of chips 150 can communicate with each other through the interconnection layer 130 while the chips 150 are connected with the mother board 180 through the internal structure of the organic base substrate 110. Thus, the interconnection substrate 100 provides a chip-to-chip interconnect bridge functionality by the interconnection layer 130 that is formed merely on the defined area 110a of the organic base substrate 110 and pitch adaptation functionality through other areas of the organic base substrate 110.

Figure 7A:
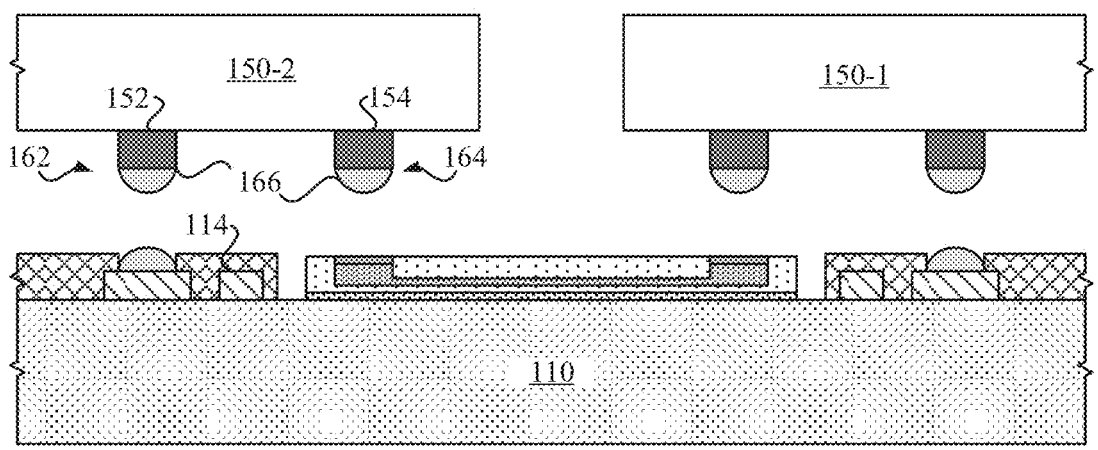
FIG. 7A illustrates a cross-sectional view of the electronic device before chip mounting according to an embodiment of the present invention.
Figure 7B:
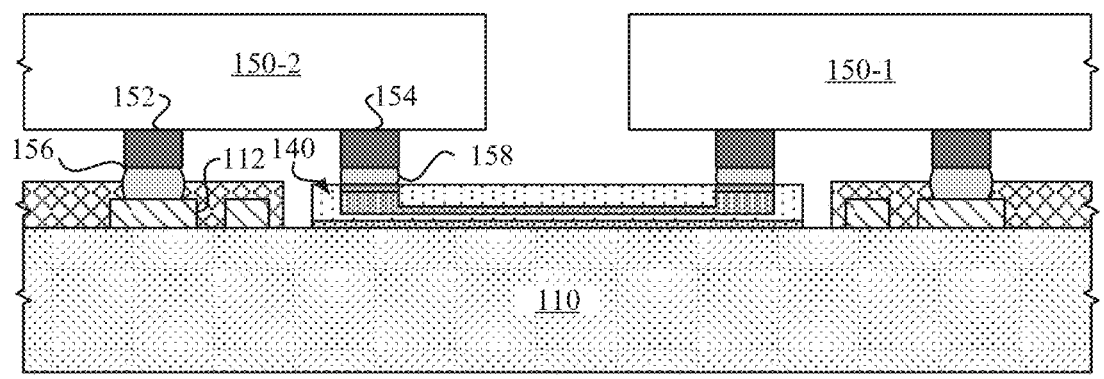
FIG. 7B illustrates a cross-sectional view of the electronic device after chip mounting according to an embodiment of the present invention.
Figure 7C:
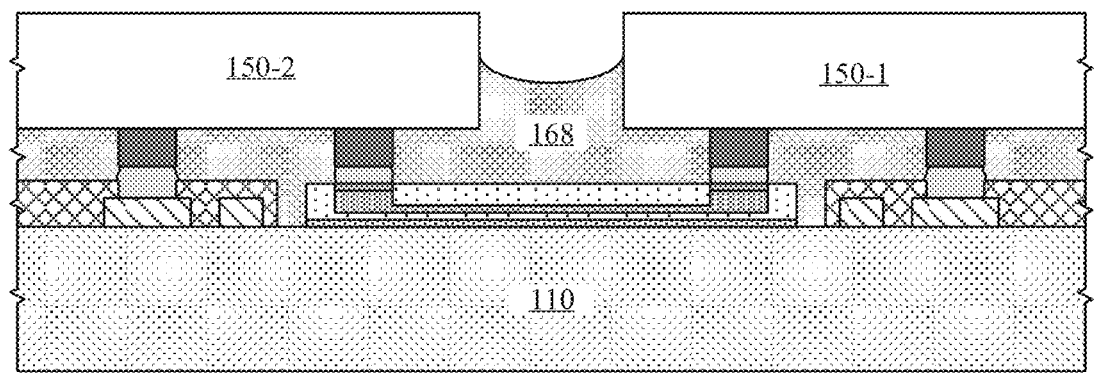
FIG. 7C illustrates a cross-sectional view of the electronic device after chip mounting and underfilling according to an embodiment of the present invention.

Referring to FIGS. 7A-7C, a process for fabricating an electronic device by mounting chips on an interconnection substrate according to an exemplary embodiment of the present invention is described. FIGS. 7A-7C illustrate cross-sectional views of structure being obtained at each step of the fabrication process of the electronic device 190.

As shown in FIG. 7A, the fabrication process of the electronic device may include a step of placing chips 150 with an active surface facing down on the interconnection substrate 100. The chips 150 prepared for this step may include bumps 162, 164, each of which may be made up of the pillar 152/154 and a solder cap 166 formed thereon. In the described embodiment, the bumps 162, 164 are Cu pillar bumps. However, in another embodiment, the bump 162/164 may be any one of standard bumps including standard flip-chip bump, fine-pitch, micro-bump, Cu pillar bump, Cu post bump with a Sn cap (SLID), etc. In the described embodiment, there is no solder on the pads 140 of the interconnection substrate 100 prepared for this step since each pad 140 has the metal stack 138 on top, which improves wettability. However, applying solder on the pads 140 of the interconnection layer 130 before chip mounting is not excluded.

As shown in FIG. 7B, the fabrication process of the electronic device may include a step of forming solder interconnection 156, 158 between the electrodes and pads 112, 140 and the pillars 152, 154 by solder reflow process.

As shown in FIG. 7C, the fabrication process of the electronic device may include a step of dispensing a underfill 168 to fill a gap between the interconnection substrate 100 and the chips 150 by capillary flow underfill process, followed by curing.

In the described embodiment, the underfill 168 is described as being applied onto the organic base substrate 110 after it has been subjected to the reflow treatment. However, in other embodiment, no-flow underfill may be dispensed on the interconnection substrate 100 at first. Then, chips 150 are placed on the interconnection substrate 100 where the underfill has been dispensed. Finally, forming of the solder interconnections 156, 158 and curing of the underfill are performed by a reflow treatment, simultaneously. In the described embodiment, solder reflow process is used as bonding process. However, in other embodiment, thermal compression (TC) bonding process may also be contemplated instead of the solder reflow process.

Since the electrical connection between the chip 150 and the interconnection substrate 100 are achieved by forming solder interconnection between the bump 162/164 and electrodes/pads 112/140, the solder resist layer 116 and the interconnection layer 130 have identical or similar top levels so that difference in the top levels between the solder resist layer 116 and the interconnection layer 130 is in a range capable of being absorbed by forming solder interconnections 156, 158.

In the exemplary embodiment, each pad 140 configured to receive a peripheral bump 164 of the chips 150 is described as being the outermost one as shown in the aforementioned figures. However, in other embodiments, there are other pads 140 configured to receive other peripheral bumps, each of which may be a second-outermost bump or more inner bump. Thus, the peripheral bumps 164 that are received by the pads 140 may include second-outermost or more inner bumps in addition to the outermost bumps. Accordingly, the pads 140 may include a pad configured to receive a second-outermost or more inner bump in addition to a pad configured to receive an outermost bump.

Figure 8:
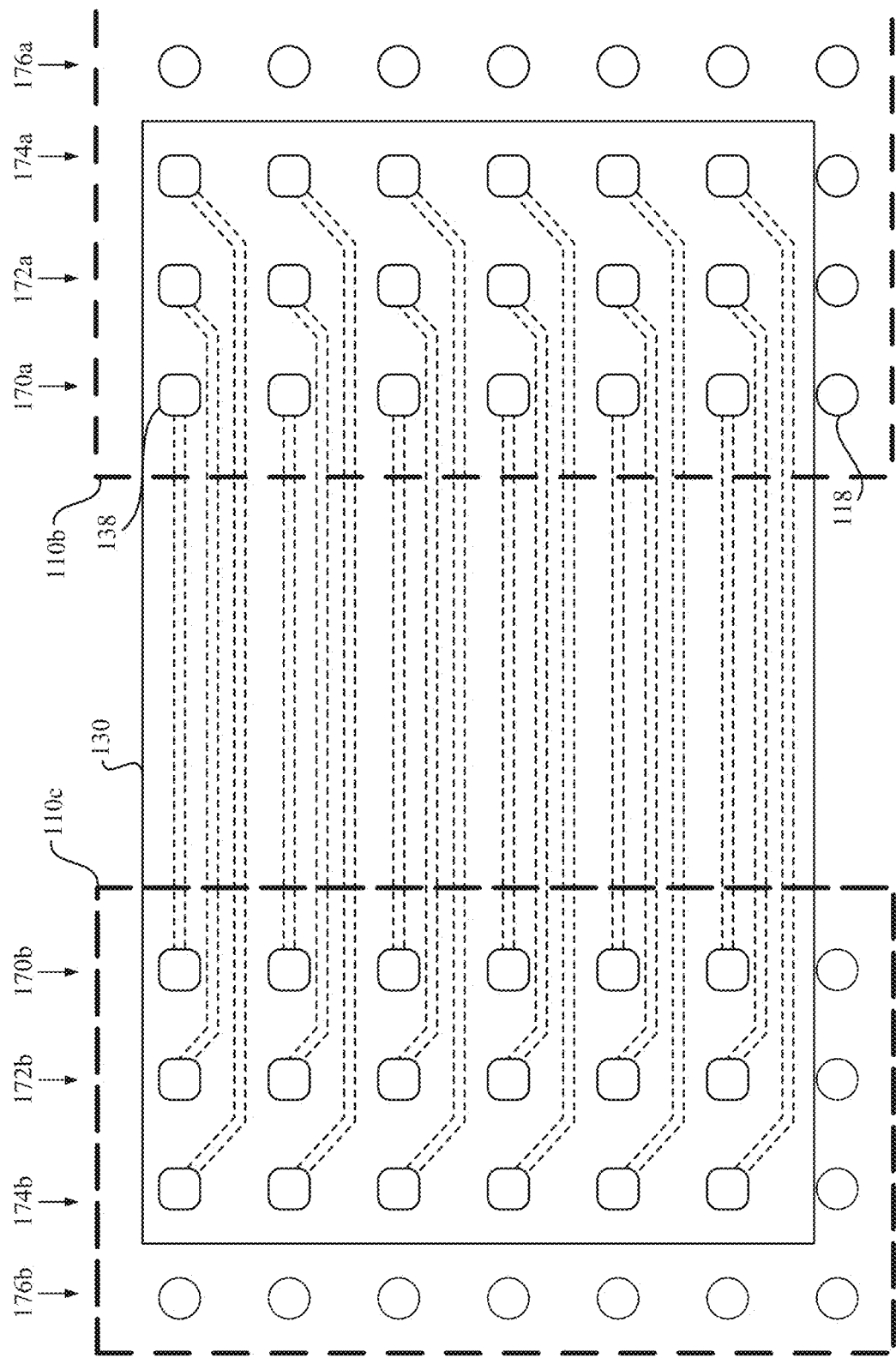
FIG. 8 illustrates a schematic of a layout of pads and traces in the interconnection layer according to an embodiment of the present invention.

Referring to FIG. 8, a schematic of a layout of pads and traces in interconnection layer 130 according to a particular embodiment of the present invention is shown. Note that the pre-solders 118 formed on the electrodes 112 and the metal stack 138 of the pads 140 are depicted in view of FIG. 8. As shown in FIG. 8, there are innermost (or third outermost) pads 170a, 170b for outermost bumps, second-outermost pads 172a, 172b for second-outermost bumps, and outermost pads 174a, 174b for third-outermost bumps for each flip-chip area 110b, 110c. In such manner, high density interconnections between chips 150 can be achieved.

Note that the layout of pads and traces in the interconnection layer described in FIG. 8 is depicted as having a single wiring layer. However, in other embodiments, the interconnection layer 130 may have a plurality of wiring layers and insulating layers in order to achieve further higher density of interconnections.

Figure 9A:
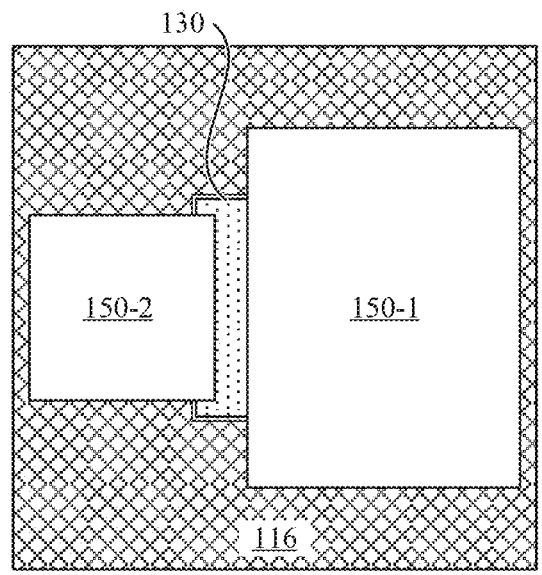
FIG. 9A depicts a schematic of an electronic device including the interconnection substrate with two chips mounted according to another embodiments of the present invention.
Figure 9B:
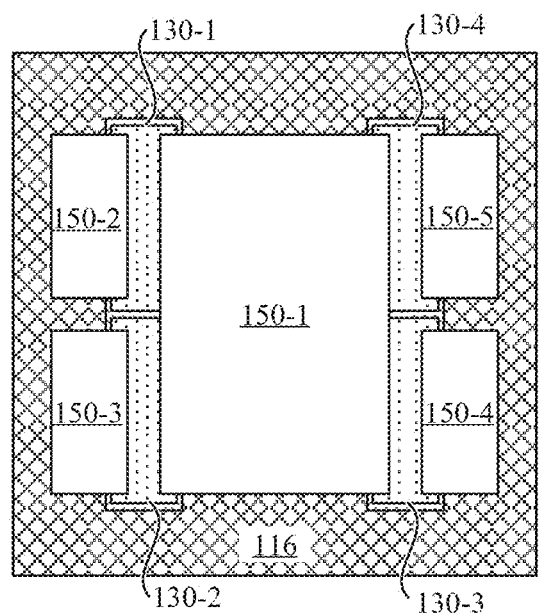
FIG. 9B depicts a schematic of an electronic device including the interconnection substrate with five chips mounted according to another embodiments of the present invention.

Referring to FIGS. 9A-9B, schematics of an electronic device that includes the interconnection substrate according to other particular embodiments of the present invention are described.

FIG. 9A shows a top view of an interconnection substrate 100 of an electronic device having two chips 150-1, 150-2 mounted thereon. As shown in FIG. 9A, the two chips 150-1, 150-2 communicate with each other through single interconnection layer 130. Each chip 150 may be any kind of electronic devices including digital logic chip, memory chip, RF/analog chip, etc.

FIG. 9B shows a top view of an interconnection substrate 100 of another electronic device having one central chip 150-1 and four peripheral chips 150-2-150-5 mounted thereon. The central chip (e.g. CPU, GPU, SoC) can access the peripheral chips (e.g., HBM (High Bandwidth Memory)) through respective interconnection layers 130-1-130-4.

Hereinafter, referring to FIGS. 10A-10F, FIGS. 11A-11D and FIGS. 12A-12D, a process for fabricating an interconnection layer carrying structure, which can be used to transfer an interconnection layer onto an organic base substrate, according to an exemplary embodiment of the present invention is described. FIGS. 10A-10F, FIGS. 11A-11D and FIGS. 12A-12D illustrate cross-sectional views of structure being obtained at each step of the fabrication process of the interconnection layer carrying structure 120.

Figure 10A:
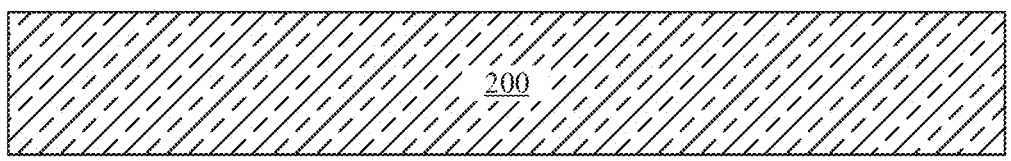
FIG. 10A illustrates a cross-sectional view of a support substrate an a carrying structure for an interconnection layer according to an embodiment of the present invention.

As shown in FIG. 10A, the fabrication process of the interconnection layer carrying structure 120 may include a step of preparing an support substrate 200. The support substrate 200 is suitably any substrate as long as it provides adequate rigidity and stability. In an embodiment, the support substrate 200 prepared by this step may be a glass wafer or a glass panel. The thickness of the support substrate 200 may range from several hundreds of micrometers to several millimeters, for example.

Figure 10B:
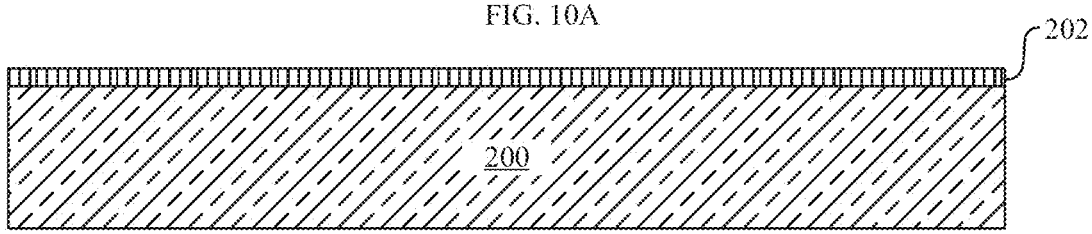
FIG. 10B illustrates a cross-sectional view of a release layer formed on the carrying structure of FIG. 10A according to an embodiment of the present invention.

As shown in FIG. 10B, the fabrication process may include a step of applying a release layer 202 on the support substrate 200. The release layer 202 may be formed by virtually any standard means including spin coating. In one embodiment, the thickness of the release layer 202 may be approximately or less than 1 μm (micrometer), for example.

Figure 10C:
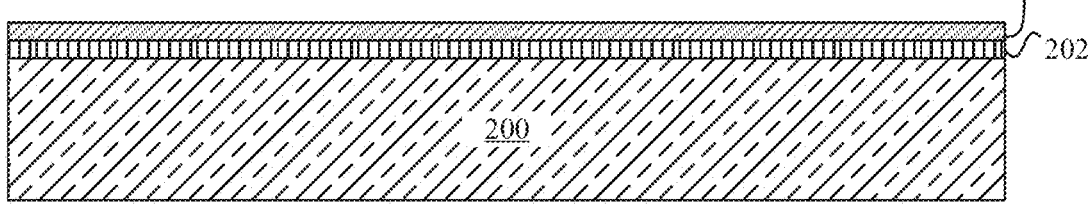
FIG. 10C illustrates a cross-sectional view of a first seed metal layer formed on the carrying structure of FIG. 10B according to an embodiment of the present invention.

As shown in FIG. 10C, the fabrication process may include a step of applying a first seed metal layer 204 on the release layer 202. The first seed metal layer 204 may be formed on the release layer 202 by virtually any standard means including sputtering and electroless plating. In one embodiment, a titanium layer and a copper layer are formed by sputtering on the release layer 202 to obtain the first seed metal layer 204. The total thickness of the seed metal layer 204 may range from several tens of nanometers to several hundreds of nanometers. In one embodiment, the titanium layer may have several tens of nanometers thickness and the copper layer may have several tens of nanometers the thickness.

Figure 10D:
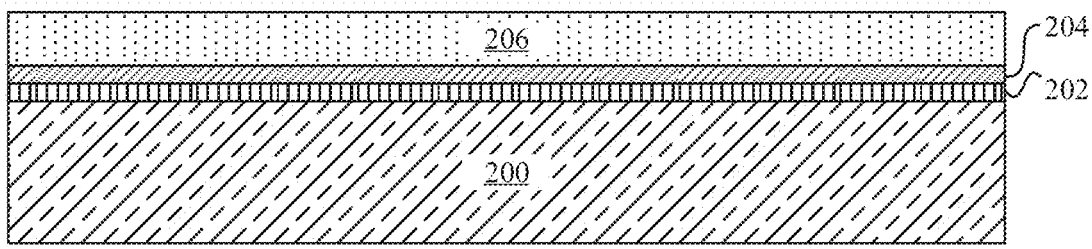
FIG. 10D illustrates a cross-sectional view of insulating material layer formed on the carrying structure of FIG. 10C according to an embodiment of the present invention.

As shown in FIG. 10D, the fabrication process may include a step of depositing a first organic insulating material layer 206 on the first seed metal layer 204. In a particular embodiment, the first organic insulating material layer 206 may be made of any one of photosensitive insulating resins. The thickness of the first organic insulating material layer 206 may range from several micrometers to several tens of micrometers. The first organic insulating material layer 206 may be formed by virtually any standard means including spin coating.

Figure 10E:
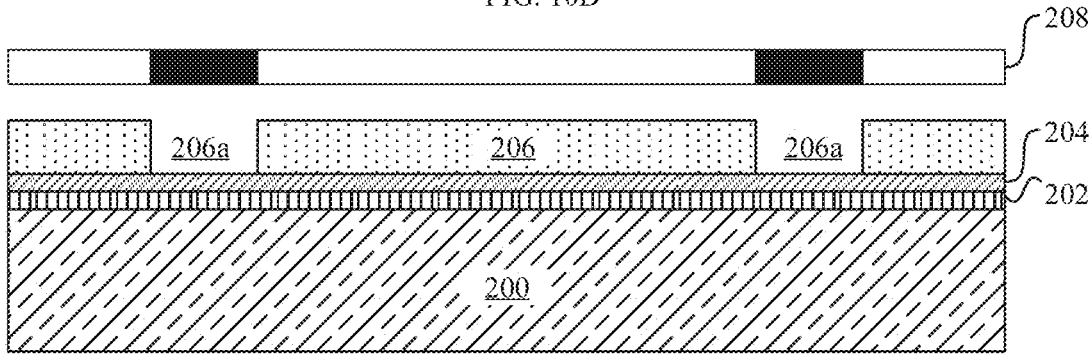
FIG. 10E illustrates a cross-sectional view of a photomask for processing the carrying structure of FIG. 10D according to an embodiment of the present invention.

As shown in FIG. 10E, the fabrication process may include a step of making a plurality of a openings 206a into the first organic insulating material layer 206. The openings 206a may be fabricated by virtually any standard means including photolithography. In a particular embodiment, the photosensitive insulating resin deposited by spin coating is exposed through a photomask 208 and developed to make the openings 206a. In other embodiment where a non-photosensitive insulating resin is used to form the first organic insulating material layer 206, the openings may be fabricated by laser processing. In a particular embodiment, the diameter of the opening (hole) 206a may range from 5 to 25 μm (micrometers) with a pitch ranging from 10 to 40 μm (micrometers).

By performing the steps shown in FIGS. 10D and 10E, the structure of the first organic insulating material layer 206 that has the plurality of the openings 206a each located at a predetermined position is formed.

Figure 10F:
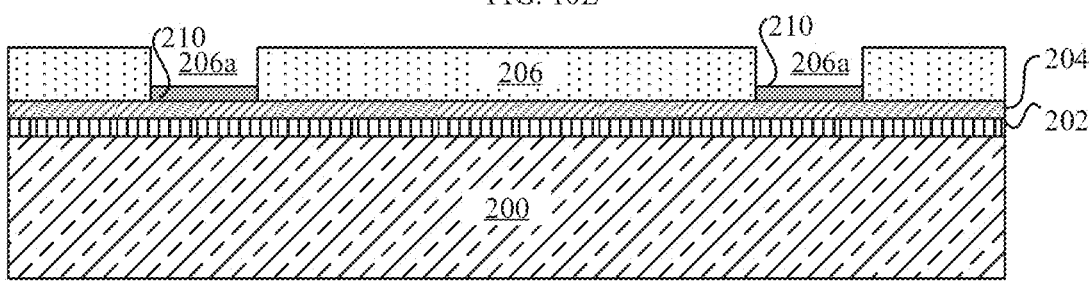
FIG. 10F illustrates a cross-sectional view of the carrying structure of FIG. 10E with openings having metal stacks according to an embodiment of the present invention.

As shown in FIG. 10F, the fabrication process may further include a step of forming metal stacks 210 on the first seed metal layer 204 at positions of the openings 206a. In a particular embodiment, each metal stack 210 is an Au/Pd/Ni metal stack, which may include a gold layer on the first seed metal layer 204, a palladium layer on the gold layer and a nickel layer on the palladium layer so that the gold layer becomes top when the resultant interconnection layer 130 is transferred onto the organic base substrate 110 in the fabrication process of the interconnection substrate 100. The metal stack 210 may be formed by virtually any standard metallization process, which may include electrolytic plating on the first seed metal layer 204.

Figure 11A:
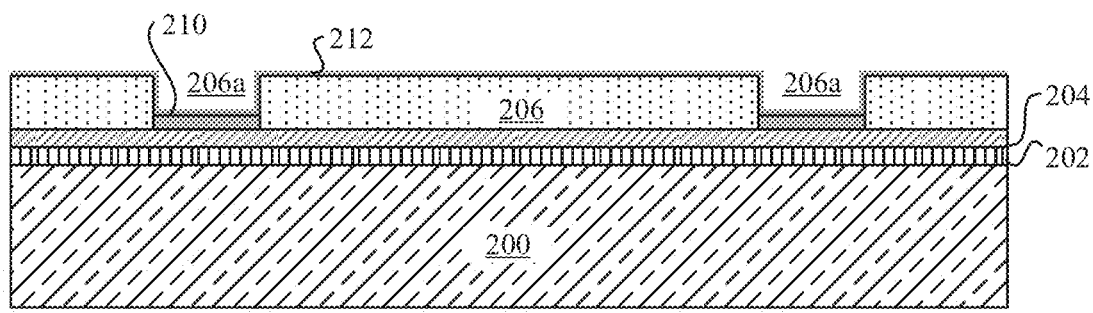
FIG. 11A illustrates a cross-sectional view of the support structure of FIG. 10F with a second seed metal layer applied according to an embodiment of the present invention.

As shown in FIG. 11A, the fabrication process may include a step of applying a second seed metal layer 212 on the first organic insulating material layer 206 and exposed surfaces in the openings 206a. The second seed metal layer 212 may be formed by virtually any standard means including sputtering and electroless plating. In a particular embodiment, a copper is deposited by sputtering or electroless plating to form the second seed metal layer 212.

Figure 11B:
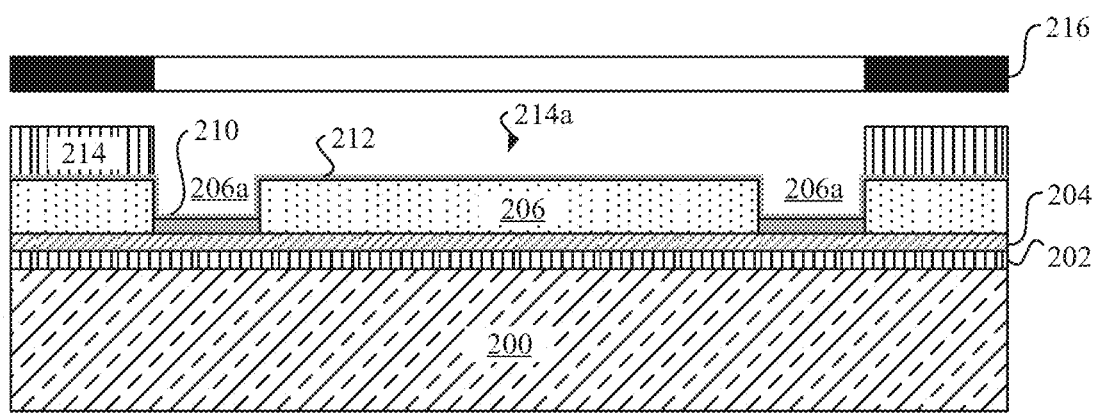
FIG. 11B illustrates a cross-sectional view of the support structure of FIG. 11A being processed with a resist and photomask according to an embodiment of the present invention.

As shown in FIG. 11B, the fabrication process may include a step of patterning a resist 214 on the second seed metal layer 212 so that the resist 214 has one or more openings 214a with a predetermined pattern that corresponds to the pads and the traces. The resist 214 may be fabricated by virtually any standard means including photolithography. In an embodiment, the resist film 214 disposed on the second seed metal layer 212 is exposed through a photomask 216 and developed to form the patterned openings 214a.

Figure 11C:
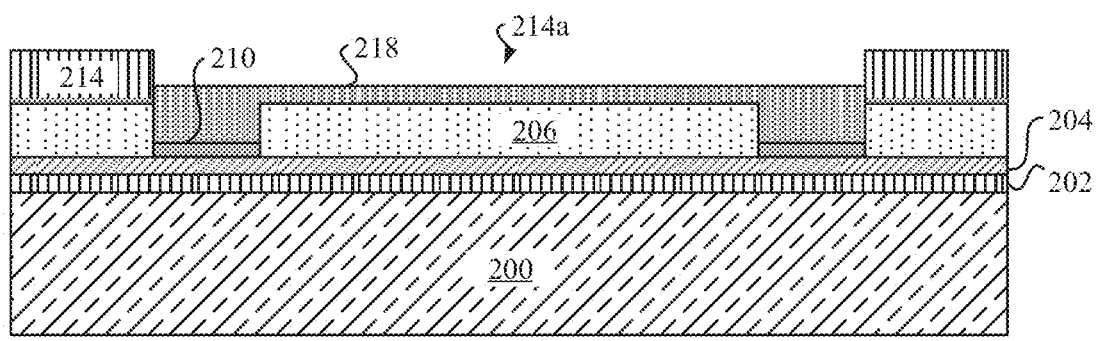
FIG. 11C illustrates a cross-sectional view of the support structure of FIG. 11B with a conductive material deposited according to an embodiment of the present invention.

As shown in FIG. 11C, the fabrication process may include a step of depositing conductive material 218 in the one or more openings 214a with the predetermined pattern. In one embodiment, the conductive material 218 may be a Cu, which may be formed by virtually any standard metallization process including electrolytic plating on the second seed metal layer 212.

Figure 11D:
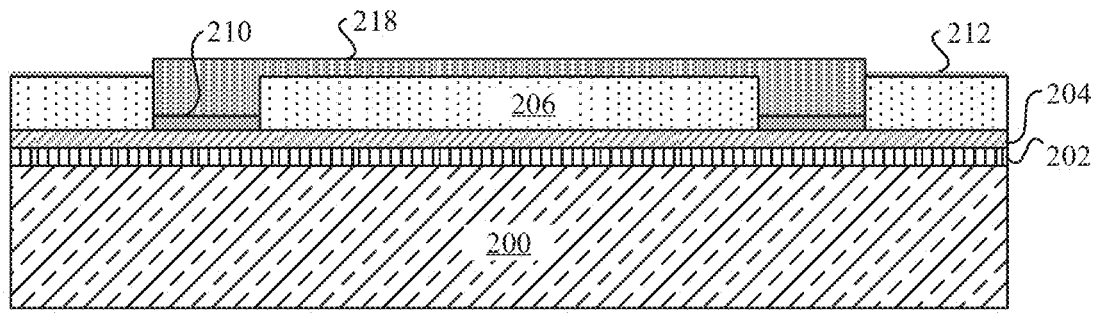
FIG. 11D illustrates a cross-sectional view of the support structure of FIG. 11C with the resist removed from the second seed metal layer according to an embodiment of the present invention.

As shown in FIG. 11D, the fabrication process may include a step of stripping the resist 214 from the second seed metal layer 212. By performing the steps shown in FIGS. 11B-11D, the conductive material 218 having the predetermined pattern are deposited on the second seed layer 212.

Figure 12A:
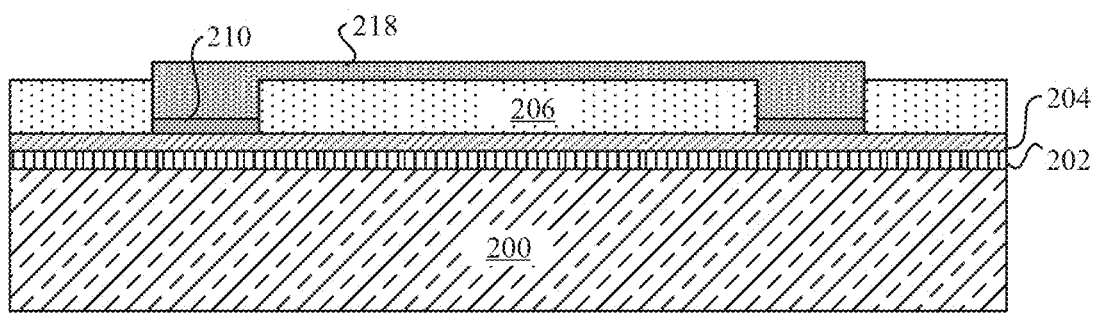
FIG. 12A illustrates a cross-sectional view of the support substrate of FIG. 11D with the second seed metal layer removed according to an embodiment of the present invention.

As shown in FIG. 12A, the fabrication process may include a step of removing the second seed metal layer 212, which may include a part outside the predetermined pattern of the conductive material 218.

By performing the steps shown in FIGS. 11A-11D and FIG. 12A, the plurality of the pads are built in the openings and the plurality of the traces are built on the first organic insulating material layer 206. In a preferable embodiment, the traces in the interconnection layer 130 can have a wiring density of line/space=2/2 micrometers. The thickness of the traces may be several micrometers.

Figure 12B:
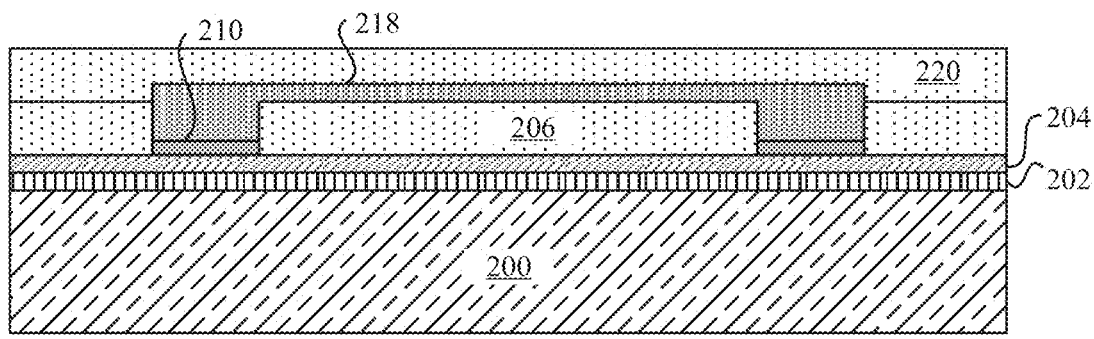
FIG. 12B illustrates a cross-sectional view of the support substrate of FIG. 12A with a second organic insulating material applied according to an embodiment of the present invention.

As shown in FIG. 12B, the fabrication process may further include a step of forming a second organic insulating material layer 220 over the conductive material (traces) 218 and the first organic insulating material layer 206. In one embodiment, the second organic insulating material layer 220 may be made of any one of photosensitive insulating resins. The second organic insulating material layer 220 may be formed by virtually any standard means including spin coating. The thickness of the second organic insulating material layer 206 may be several micrometers.

Figure 12C:
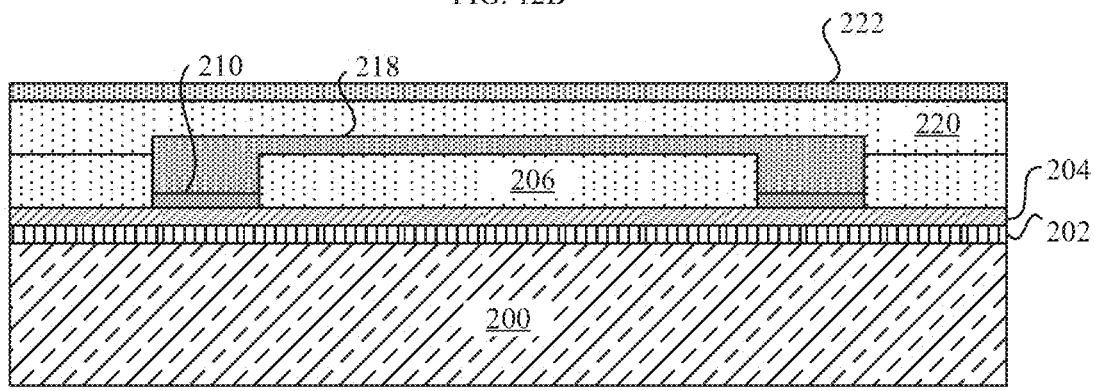
FIG. 12C illustrates a cross-sectional view of the support substrate of FIG. 12B with an adhesive layer applied according to an embodiment of the present invention.

As shown in FIG. 12C, the fabrication process may include a step of forming an adhesive layer 222 on a top of the second organic insulating material layer 220, followed by pre-curing. The thickness of the adhesive layer 222 may be several micrometers. The adhesive layer 222 may be formed by dispensing adhesive material or laminating adhesive film on the top of the second organic insulating material layer 220.

Figure 12D:
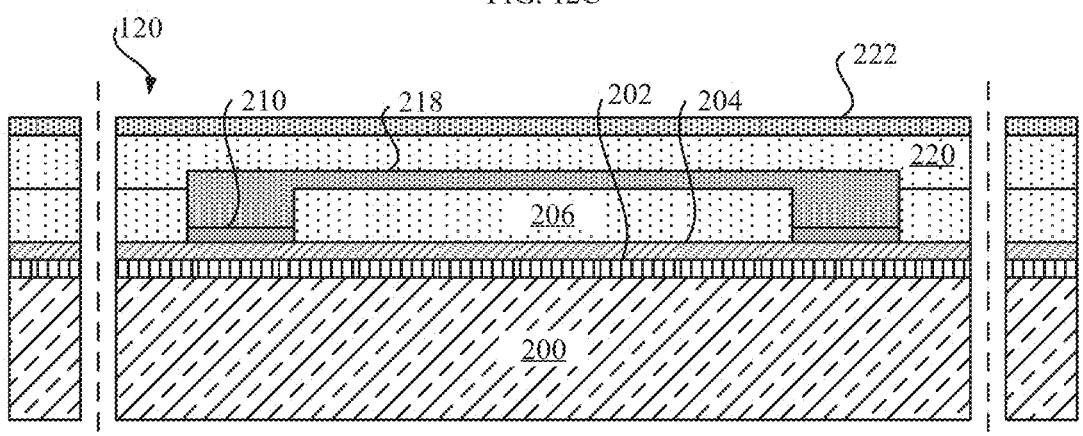
FIG. 12D illustrates a cross-sectional view of the support substrate of FIG. 12C being undergoing dicing according to an embodiment of the present invention.

As shown in FIG. 12D, the fabrication process may include a step of dicing the support substrate 200, which may be the glass wafer or the glass panel, with its superstructure (including the release layer 202, the first seed metal layer 204, the first and second organic insulating material layers 206, 220, and the adhesive layer 222), to obtain a structure identical to the interconnection layer carrying structure 120 shown in FIG. 2.

The interconnection layer carrying structure 120 obtained by this process can be passed to a subsequent process such as interconnection substrate fabrication. In one embodiment, the interconnection layer carrying structure 120 segmented from the glass wafer or the glass panel by dicing may be provided to next in a production chain. In another embodiment, the interconnection layer carrying structure 120 in a form of wafer or panel as shown in FIG. 12C may be provided to the next in the production chain. The interconnection layer 130 is provided as a form of an adhesive tape formed by organic material.

Hereinafter, referring to FIGS. 13A-13C, schematics of a related package structure for electronic devices are described.

Figure 13A:
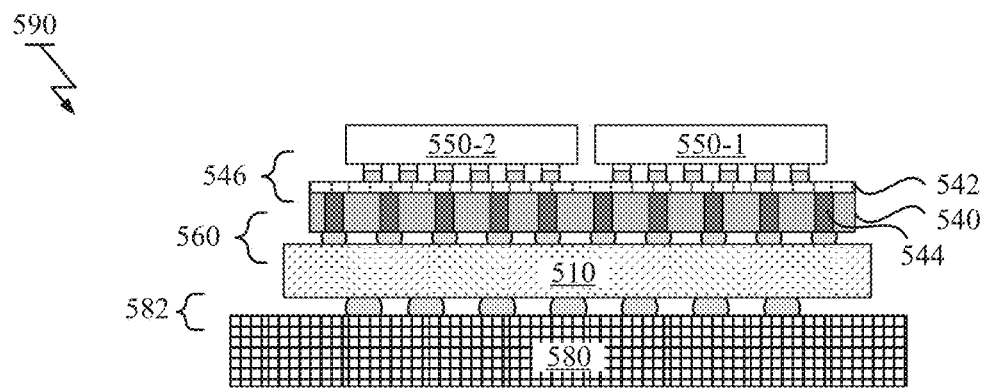
FIG. 13A shows a schematic of a prior art Back end Of Line (BEOL) silicon interposer package according to another embodiment of the present invention.

FIG. 13A shows a schematic of silicon interposer package structure 590. As shown in FIG. 13A, the package structure 590 may include a plurality of chips 550 that are mounted on a silicon interposer 540 through flip-chip interconnections 546 between the chips 550 and the BEOL 542 on the silicon interposer 540. The silicon interposer 540 may have TSVs 544 and bumps formed at the bottom, and may be further mounted on an organic package substrate 510 through interconnections 560. The organic package substrate 510 may have bumps formed at the bottom, and may be further mounted on a motherboard 580 through package interconnections 582.

In the silicon interposer package structure 590, fabrication processes of the BEOL 542 and the TSVs 544, especially Cu plating during the TSV process, are expensive. Thus, production cost is generally high. Also large insertion loss would be caused in the TSV since the silicon into which the TSVs are fabricated is a semiconductor, not an insulator.

Figure 13B:
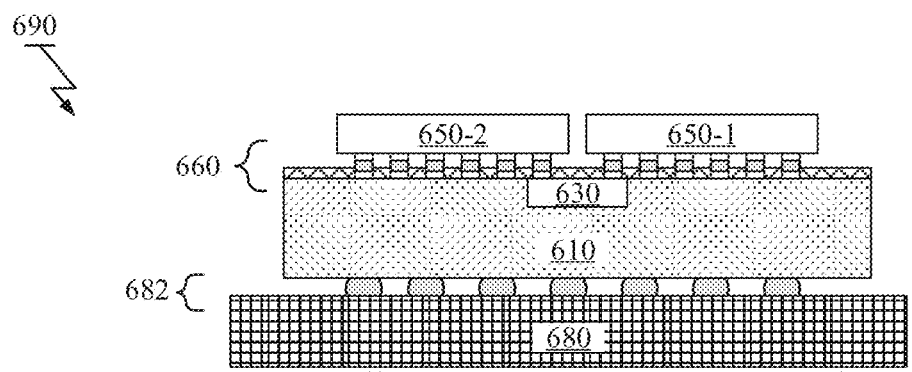
FIG. 13B shows a schematic of a prior art Embedded Multi-Die Interconnect Bridge (EMIB) silicon interposer package according to another embodiment of the present invention.

FIG. 13B shows a schematic of EMIB package structure 690. As shown in FIG. 13B, the package structure 690 may include a plurality of chips 650 that are mounted on an organic package substrate 610 through flip-chip interconnections 660. The organic package substrate 610 includes a silicon bridge interconnect assembly 630 embedded therein, which includes a BEOL. The organic package substrate 610 may have bumps formed at the bottom and may be further mounted on a mother board 680 through package interconnections 682.

Since the bridge interconnect assembly 630 is typically made of semiconductor material such as silicon, a problem of mechanical stress due to CTE mismatch between the organic package substrate 610 and the silicon bridge interconnect assembly 630 would arise, which may results in negative impacts on interconnection reliability and production yield.

Figure 13C:
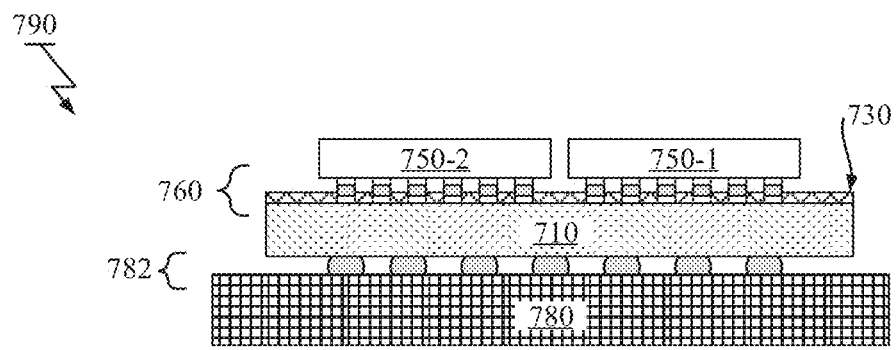
FIG. 13C shows a schematic of a prior art integrate Thin film High density Organic Package (iTHOP) silicon interposer package according to another embodiment of the present invention.

FIG. 13C shows a schematic of iTHOP package structure 790. As shown in FIG. 13C, the package structure 790 may include a plurality of chips 750 that are mounted on an organic package substrate 710 through flip-chip interconnections 760. The organic package substrate 710 may include an interconnection layer 730 formed over the top surface of the organic package substrate 710. The package substrate 710 may be further mounted on a mother board 780 through package interconnections 782.

In the iTHOP package structure 790, fabrication process includes expensive CMP (Chemical Mechanical Polishing) process as well as delicate fabrication process to form a high density interconnection layer 730 over the package substrate 710. The organic package substrate 710 onto which the interconnection layer is fabricated is generally unstable and warped in comparison with rigid inorganic substrates such as glass. Thus, yield of the interconnection layer 730 itself would be typically low. Furthermore, when the interconnection layer 730 is found to have a defect, it is necessary to discard the entire assembly including the organic package substrate 780 that may be a build-up substrate since the interconnection layer is built on the organic package substrate 710. Thus, production yield of the electronic package assembly would be lowered and the production cost of the electronic package assembly would be increased. Also, due to the nature of the fabrication process of the interconnection layer 730, it is necessary that the interconnection layer 730 should be formed on the entire top surface of the organic package substrate 780.

In contrast to the aforementioned related package structures, signal transmission between the chips can be achieved through the interconnection layer that includes organic insulating material and is located within the defined area on the base substrate in the interconnection substrate according to one or more embodiments of the present invention.

By employing the structure that enables bonding of the interconnection layer with the base substrate, the base substrate and the interconnection layer having interconnections formed separately from the base substrate can be assembled. The interconnections in the interconnection layer can be precisely formed on another substrate that may be more rigid and stable than the base substrate. Thus, production yield of the interconnection layer is expected to be high even though wiring density increases. With respect to the conventional wiring technologies for buildup substrate, line/space of 10/10 μm may be a limit in mass production. On the other hand, according to one or more embodiments of the present invention, it is expected that a wiring density of line/space of 2/2 micrometers can be achieved.

Furthermore, when the interconnection layer is found to have a defect, it is only necessary to discard the interconnection layer instead of entire assembly including the base substrate since the interconnection layer that passes an inspection can be assembled to the base substrate. Therefore, the production yield of the interconnection substrate can be improved and the production cost of the interconnection substrate can be reduced.

Since the CTE of the interconnection layer can be adapted to be closer to that of the base substrate than a silicon interposer and the embedded silicon interconnect bridge assembly, CTE mismatch between the interconnection layer and the base substrate can be alleviated. Note that the support substrate that may also cause CTE mismatch to the base substrate no longer exists in the interconnection substrate. Furthermore, since the interconnection layer may be provided as being fabricated on a support substrate in a form of an adhesive tape, interconnection in the interconnection layer can be precisely formed and transferred onto the base substrate efficiently. Thus, production cost of the interconnection substrate can be reduced.

As described above, according to one or more embodiments of the invention, inexpensive, high density interconnections can be achieved for interconnections between chips mounted thereon while keeping reliability of the interconnections.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description, but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An interconnection substrate for interconnecting chips, the interconnection substrate comprising:
   an organic base substrate;
   a first group of electrodes on the base substrate for a first chip to be mounted;
   a second group of electrodes on the base substrate for a second chip to be mounted; and
   an interconnection layer including a first set of pads corresponding to the first chip, a second set of pads corresponding to the second chip, wherein each pad of the first and second set is positioned inside of, and surrounded on all except one side by, the interconnection layer, and has a surface that is coplanar with a surface of the interconnection layer that is opposite the base substrate, a plurality of traces integrally formed with the first set of pads and the second set of pads with each of the plurality of traces coplanar within an organic insulating material, the interconnection layer being disposed on the base substrate and located within a defined area on the base substrate between the first group of electrodes and the second group of the electrodes.

2. The interconnection substrate of claim 1, the interconnection layer further includes a bottom adhesive layer bonded to the base substrate.

3. The interconnection substrate of claim 2 wherein the organic insulating material is disposed on the bottom adhesive layer, the plurality of the traces is embedded in the organic insulating material and each trace is electrically connected to a corresponding pad in the first set and a corresponding pad in the second set.

4. The interconnection substrate of claim 1, wherein the first set of pads and the first group of electrodes are configured to receive a set of peripheral bumps and a set of other bumps of the first chip, respectively, and the second set of pads and the second group of electrodes are configured to receive a set of peripheral bumps and a set of other bumps of the second chip, respectively.

5. The interconnection substrate of claim 1, wherein the first set of pads include at least a pad configured to receive a second-outermost bump of the first chip in addition to a pad configured to receive an outermost bump of the first chip and the second set of pads includes at least a pad configured to receive a second-outermost bump of the second chip in addition to a pad configured to receive an outermost bump of the second chip.

6. The interconnection substrate of claim 1, wherein the base substrate has a solder resist layer on a top surface thereof, each electrode in the first group and the second group is exposed from the solder resist layer, and the defined area where the interconnection layer is disposed is not covered by the solder resist layer.

7. The interconnection substrate of claim 6, wherein each pad in the first set and each pad in the second set are exposed at the top surface of the interconnection layer, and the solder resist layer and the interconnection layer have respective heights such that a difference in heights between the solder resist layer and the interconnection layer is in a range capable of being bridged when forming solder interconnection.

8. The interconnection substrate of claim 1, wherein the interconnection layer is provided by fabricating a structure of the interconnection layer on a support substrate and transferring the structure without the support substrate onto the base substrate.

9. The interconnection substrate of claim 1, wherein the interconnection substrate further comprises;
a third group of electrodes on the base substrate for a third chip to be mounted; and
a second interconnection layer including a third set of pads for the third chip and a fourth set of pads for the first chip, the second interconnection layer being disposed on the base substrate and located within a second defined area on the base substrate between the third group of electrodes and the first group of electrodes, the second interconnection layer being formed as a part of the interconnection layer or as being separated from the interconnection layer.

10. An electronic device comprising:
the interconnection substrate of claim 1;
the first chip mounted on the interconnection substrate, the first chip being located at a position corresponding to the first group of electrodes and the first set of pads of the interconnection layer; and
a second chip mounted on the interconnection substrate, the second chip being located at a position corresponding to the second group of electrodes and the second set of pads of the interconnection layer.

11. The interconnection substrate of claim 1, wherein each pad comprises a metal stack.

12. An interconnection layer carrying structure for transferring an interconnection layer onto a substrate, the interconnection layer carrying structure comprising:
a support substrate;
a release layer on the support substrate; and
an interconnection layer on the release layer, comprising:
an organic insulating material;
a first set of pads configured to face towards the support substrate;
a second set of pads configured to face towards the support substrate, wherein each pad of the first and second set has a surface that is coplanar with an interface between the organic insulating material and an intervening layer between the organic insulating material and the support substrate;
a plurality of traces integrally formed with the first set of pads and the second set of pads with each of the plurality of traces coplanar and embedded in the organic insulating material; and
an adhesive layer formed on a side of the organic insulating material opposite to the support substrate.

13. The interconnection layer carrying structure of claim 12, wherein each pad in the first set of pads connects with one of the traces, each pad in the second set of pads connects with a corresponding one of the traces, and the pads of the first set of pads and the pads of the second set of pads are exposed at a bottom surface of the organic insulating material.

14. The interconnection layer carrying structure of claim 12, wherein the interconnection layer carrying structure further comprises:
a metal layer on the release layer, the organic insulating material being disposed on the metal layer, each pad in the first set of pads and the second set of pads including a metal stack formed on the metal layer.

15. The interconnection layer carrying structure of claim 12, wherein each pad comprises a metal stack.

16. The interconnection layer carrying structure of claim 12, wherein the release layer is disposed between a metal layer and the support substrate.

* * * * *